US011062513B2

(12) United States Patent
Zhang

(10) Patent No.: US 11,062,513 B2
(45) Date of Patent: Jul. 13, 2021

(54) LIQUID SIMULATION METHOD, LIQUID INTERACTION METHOD AND APPARATUSES

(71) Applicant: TENCENT TECHNOLOGY (SHENZHEN) COMPANY LIMITED, Shenzhen (CN)

(72) Inventor: Tianxiang Zhang, Shenzhen (CN)

(73) Assignee: TENCENT TECHNOLOGY (SHENZHEN) COMPANY LIMITED, Shenzhen (CN)

( * ) Notice: Subject to any disclaimer, the term of this patent is extended or adjusted under 35 U.S.C. 154(b) by 20 days.

(21) Appl. No.: 16/601,736

(22) Filed: Oct. 15, 2019

(65) Prior Publication Data
US 2020/0043230 A1 Feb. 6, 2020

Related U.S. Application Data

(63) Continuation of application No. PCT/CN2018/101329, filed on Aug. 20, 2018.

(30) Foreign Application Priority Data

Sep. 13, 2017 (CN) .......................... 201710823492.8

(51) Int. Cl.
*G06T 17/20* (2006.01)
*A63F 9/08* (2006.01)
(Continued)

(52) U.S. Cl.
CPC ............ *G06T 17/20* (2013.01); *A63F 9/0826* (2013.01); *G06T 11/60* (2013.01); *G06T 13/60* (2013.01);
(Continued)

(58) Field of Classification Search
CPC ...... G06T 17/20; G06T 2210/56; G06T 11/60; G06T 13/60; G06T 15/005; G06T 15/04; A63F 9/0826
See application file for complete search history.

(56) References Cited

U.S. PATENT DOCUMENTS 8,204,725 B1 * 6/2012 Thuerey ............... G06T 13/60
703/9
2005/0233805 A1 * 10/2005 Okajima ............. G06T 15/40
463/31
(Continued)

FOREIGN PATENT DOCUMENTS

CN 102870087 A 1/2013
CN 104268943 A 1/2015
(Continued)

OTHER PUBLICATIONS

Müller, Matthias, "Real-time Simulation of Large Bodies of Water with Small Scale Details", ResearchGate, Jan. 2010, pp. 197-206 (Year: 2010).*
(Continued)

*Primary Examiner* — Terrell M Robinson
(74) *Attorney, Agent, or Firm* — Anova Law Group, PLLC

(57) ABSTRACT

A liquid simulation method is provided for a graphics processing unit (GPU). The method includes obtaining initial information; determining two-dimensional meshes according to the initial information; mapping a plane of a to-be-simulated three-dimensional liquid into the two-dimensional meshes, and determining corresponding target meshes to which the plane of the to-be-simulated three-dimensional liquid is mapped in the two-dimensional meshes. The method also includes recording, in mesh points of the target meshes, corresponding liquid levels of plane coordinates of the to-be-simulated three-dimensional liquid,
(Continued)

and obtaining a corresponding height field of the to-be-simulated three-dimensional liquid in the two-dimensional meshes; and rendering a three-dimensional liquid according to updating of the height field, to obtain a liquid simulation result.

20 Claims, 10 Drawing Sheets

(51) Int. Cl.
    *G06T 11/60*     (2006.01)
    *G06T 13/60*     (2011.01)
    *G06T 15/00*     (2011.01)
    *G06T 15/04*     (2011.01)

(52) U.S. Cl.
    CPC ............ *G06T 15/005* (2013.01); *G06T 15/04* (2013.01); *G06T 2210/56* (2013.01)

(56) References Cited

U.S. PATENT DOCUMENTS

| | | | |
|---|---|---|---|
| 2013/0035913 A1 | 2/2013 | Mishev et al. | |
| 2014/0028706 A1* | 1/2014 | Praun | G06T 17/205 345/619 |
| 2015/0109291 A1* | 4/2015 | Comair | G06T 17/20 345/420 |
| 2017/0124679 A1 | 5/2017 | Dunn | |
| 2018/0031719 A1* | 2/2018 | Huang | G01V 99/005 |

FOREIGN PATENT DOCUMENTS

| | | |
|---|---|---|
| CN | 104778754 A | 7/2015 |
| CN | 106202806 A | 12/2016 |

OTHER PUBLICATIONS

Chentanez, Nuttapong, "Real-Time Eulerian Water Simulation Using a Restricted Tall Cell Grid", Jul. 2011, "ACM Transactions on Graphics", vol. 30, No. 4, pp. 1-10 (Year: 2011).*

The World Intellectual Property Organization (WIPO) International Search Report for PCT/CN2018/101329 dated Nov. 22, 2018 6 Pages (including translation).

* cited by examiner

LIQUID SIMULATION METHOD, LIQUID INTERACTION METHOD AND APPARATUSES

RELATED APPLICATION

This application is a continuation application of PCT Patent Application No. PCT/CN2018/101329, filed on Aug. 20, 2018, which claims priority to China Patent Application No. 201710823492.8, filed with the Chinese Patent Office on Sep. 13, 2017 and entitled "LIQUID SIMULATION METHOD, AND LIQUID INTERACTION METHOD AND APPARATUS", content of all of which is incorporated herein by reference in its entirety.

FIELD OF THE TECHNOLOGY

The present disclosure relates to the field of simulation technologies and, specifically, to a liquid simulation technology.

BACKGROUND OF THE DISCLOSURE

Liquid simulation can be used for simulating a three-dimensional flowing liquid, and is widely applied in scenarios such as film special effect production, computer games, and hydraulic engineering design. The liquid includes, but is not limited to, water and the like. Performance of liquid simulation is mainly measured through a liquid simulation result, vividness, and computational overheads related to liquid simulation. Especially, when liquid simulation is performed in a scenario of a computer game, liquid simulation with high vividness and low computational overheads is crucial for normal running of the computer game.

Currently, a main method of liquid simulation is a particle method based on particles. Specifically, a liquid may be approximated by using a large quantity of particles, and the liquid is simulated by calculating movement behaviors of the particles. An advantage of the particle method for liquid simulation lies in a high computing speed and low computational overheads. However, a disadvantage is that a liquid simulation result has low vividness (which is embodied in low liquid simulation precision and a rough effect). Therefore, how to reduce computational overheads of liquid simulation while ensuring vividness of a liquid simulation effect is the technical problem to be addressed in the present disclosure.

SUMMARY

Accordingly, embodiments of the present invention provide a liquid simulation method, a liquid interaction method, and apparatuses, so as to reduce computational overheads of liquid simulation while ensuring vividness of a liquid simulation effect.

According to one aspect, an embodiment of the present invention provides a liquid simulation method for a graphics processing unit (GPU). The method includes obtaining initial information; determining two-dimensional meshes according to the initial information; mapping a plane of a to-be-simulated three-dimensional liquid into the two-dimensional meshes, and determining corresponding target meshes to which the plane of the to-be-simulated three-dimensional liquid is mapped in the two-dimensional meshes. The method also includes recording, in mesh points of the target meshes, corresponding liquid levels of plane coordinates of the to-be-simulated three-dimensional liquid, and obtaining a corresponding height field of the to-be-simulated three-dimensional liquid in the two-dimensional meshes; and rendering a three-dimensional liquid according to updating of the height field, to obtain a liquid simulation result.

According to another aspect, an embodiment of the present invention further provides a liquid interaction method for a central processing unit (CPU). The method includes approximating a model of an interactive volume by using a cube group, the cube group comprising multiple cubes; and obtaining a height field of a to-be-simulated three-dimensional liquid in two-dimensional meshes. The height field corresponds to target meshes, the target meshes are corresponding meshes to which a plane of the to-be-simulated three-dimensional liquid is mapped in the two-dimensional meshes, and mesh points of the target meshes recording correspond liquid levels of the to-be-simulated three-dimensional liquid. The method also includes determining liquid levels corresponding to the cubes according to horizontal position coordinates of the cubes and the height field; determining interaction forces between the to-be-simulated three-dimensional liquid and the cubes according to the liquid levels corresponding to the cubes; and combining the interaction forces between the to-be-simulated three-dimensional liquid and the cubes, and determining an interaction force between the to-be-simulated three-dimensional liquid and the interactive volume.

According to another aspect, an embodiment of the present invention further provides a liquid simulation device. The liquid simulation device includes a central processing unit (CPU); a graphics processing unit (GPU); and one or more memory for storing program code for the CPU and for the GPU to perform: approximating, by the CPU, a model of an interactive volume by using a cube group, the cube group comprising multiple cubes, and transmitting initial information and information of the cube group to the GPU; based on the initial information, updating, by the GPU, a height field and a velocity field by using a Compute Shader, and transmitting the height field and the velocity field to the CPU; based on the height field, the velocity field, and the model of the interactive volume, calculating, by the CPU, an interaction force between the interactive volume and a three-dimensional liquid, and determining an acting force effect; and rendering, by the GPU and independently from the CPU, a three-dimensional liquid based on the updated height field using a Pixel Shader, to obtain a liquid simulation result.

Based on the foregoing technical solutions, in the liquid simulation method provided in an embodiment of the present invention, after obtaining initial information, a GPU may determine two-dimensional meshes, map a plane of a to-be-simulated three-dimensional liquid into the two-dimensional meshes, and determine corresponding target meshes to which the plane of the to-be-simulated three-dimensional liquid is mapped in the two-dimensional meshes; record, in mesh points of the target meshes, corresponding liquid levels of plane coordinates of the to-be-simulated three-dimensional liquid, to obtain a corresponding height field of the to-be-simulated three-dimensional liquid in the two-dimensional meshes; and therefore can render a three-dimensional liquid according to updating of the height field, to obtain a liquid simulation result.

It can be understood that, according to the liquid simulation method provided in the embodiment of the present invention, by determining, in two-dimensional meshes, target meshes occupied by a plane of a to-be-simulated three-dimensional liquid and recording, in mesh points of the target meshes, liquid levels of the corresponding to-be-simulated three-dimensional liquid, simulation of the to-be-simulated three-dimensional liquid can be implemented in two-dimensional meshes in a simplified manner, thereby greatly reducing the amount of computing and reducing computational overheads, so that it is possible to simulate a liquid flowing in real time. Moreover, liquid simulation is implemented by using a method based on spatial meshes (that is, the embodiment of the present invention is a three-dimensional liquid simulation method based on two-dimensional spatial meshes, which is improved from an Euler method based on spatial meshes), and can inherit a high-vividness effect brought about by liquid simulation performed based on spatial meshes, thereby reducing computational overheads of liquid simulation while ensuring vividness of a liquid simulation result.

DETAILED DESCRIPTION

Figure 1:
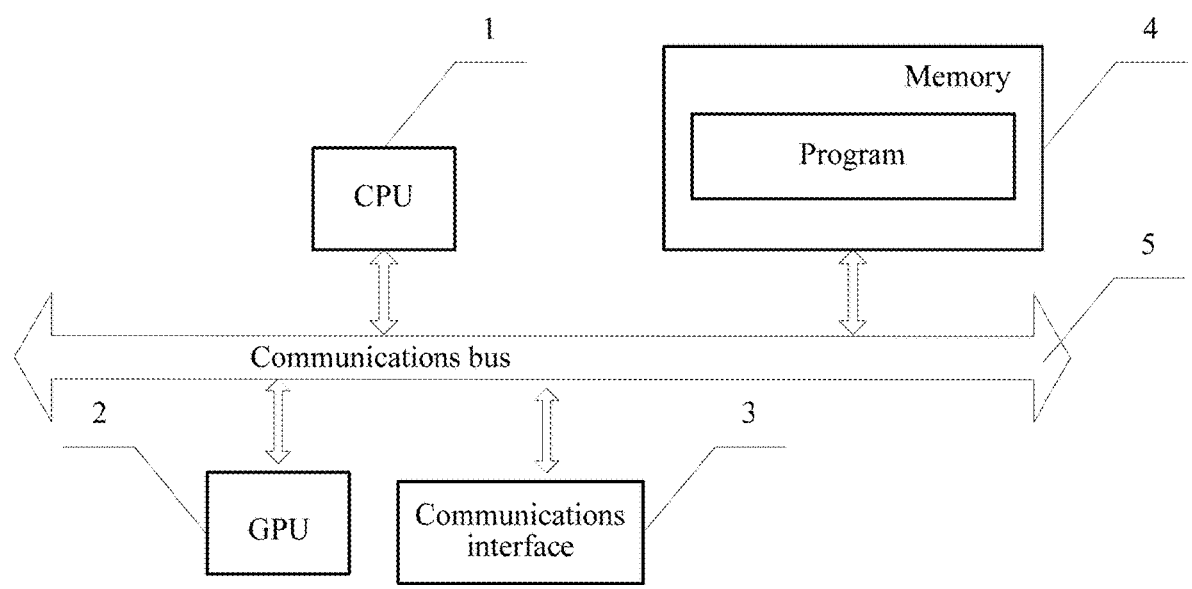
FIG. 1 is a structural block diagram of hardware of a simulation device according to an embodiment of the present disclosure.

According to the present disclosure, the liquid simulation may be performed by using an Euler method based on spatial meshes. A whole simulation space is divided into spatial meshes/grids, meshes occupied by a to-be-simulated three-dimensional liquid in the spatial meshes are determined, flow information (such as a velocity and pressure) of the liquid is calculated according to a hydrodynamic equation on each occupied grid, and the state of the liquid is updated accordingly (for example, a movement state and a shape change of the liquid are updated), to complete liquid simulation.

According to the present disclosure, comparing the Euler method based on spatial meshes and a particle method based on particles, the advantage and disadvantage of the Euler method are opposite to those of the particle method. The Euler method can express details of a liquid surface (such as a water surface) desirably, and a liquid simulation result thereof has high vividness; the disadvantage of the Euler method lies in high computational overheads. Especially, in the case of three-dimensional liquid simulation, liquid simulation can be performed only in a small area. Therefore, liquid simulation using an Euler method is undesirable for scenarios with a high requirement on real-time performance, such as a game scenario.

Accordingly, the present disclosure provides improvements based on the Euler method, and proposes liquid simulation methods to sets a corresponding process, to retain a high-vividness liquid simulation result of the Euler method while reducing computational overheads in the case of three-dimensional liquid simulation, so as to meet a real-time performance requirement of the liquid simulation method provided in the embodiments of the present disclosure, and to make applicable to scenarios with a high requirement on real-time performance, such as a game scenario.

The following describes the technical solutions in the embodiments of the present disclosure with reference to the accompanying drawings. Apparently, the described embodiments are merely some rather than all of the embodiments of the present disclosure. Other embodiments obtained by a person of ordinary skill in the art based on the embodiments of the present disclosure without creative efforts shall fall within the protection scope of the present disclosure.

The liquid simulation method provided in the embodiments of the present disclosure may be represented by a corresponding program, and a CPU (Central Processing Unit) works in coordination with a GPU (Graphic Processing Unit), to perform processes in the corresponding program of the liquid simulation method which are in the charge of the CPU and the GPU respectively, thereby implementing the liquid simulation method provided in the embodiments of the present disclosure. In addition, the liquid interaction methods further provided in the embodiments of the present disclosure may also be represented by a corresponding program, and the CPU works in coordination with the GPU, to perform processes in the corresponding program of the liquid interaction method which are in the charge of the CPU and the GPU respectively, thereby implementing the liquid interaction method provided in the embodiments of the present disclosure.

Optionally, the CPU and the GPU may be disposed on a simulation device. The simulation device is, for example, a server on a network side. Definitely, the simulation device may also be a terminal device on a user side, such as a personal computer (PC) or a smartphone.

FIG. 1 is a block diagram of a hardware structure of a simulation device. Referring to FIG. 1, the simulation device may include: a CPU 1, a GPU 2, a communications interface 3, a memory 4, and a communications bus 5.

The communications interface 2 may be an interface of a communications module.

The memory 3 may include a high-speed random-access memory (RAM), and may also include a non-volatile memory, such as at least one magnetic disk memory. The memory 3 may store a corresponding program for implementing the liquid simulation method provided in the embodiment of the present disclosure, and a corresponding program for implementing liquid interaction method provided in the embodiment of the present disclosure.

The CPU 1 and the GPU 2 may work in coordination to implement the liquid simulation method provided in the embodiments of the present disclosure. Specifically, the CPU 1 and the GPU 2 may invoke the corresponding program of the liquid simulation method stored in the memory 3, to perform processes in the liquid simulation method which are in the charge of the CPU 1 and the GPU 2 respectively, to implement the liquid simulation method provided in the embodiments of the present disclosure. The CPU 1 and the GPU 2 may work in coordination to implement the liquid interaction method provided in the embodiments of the present disclosure. Specifically, the CPU 1 and the GPU 2 may invoke the corresponding program of the liquid interaction method stored in the memory 3, to perform processes in the liquid interaction method which are in the charge of the CPU 1 and the GPU 2 respectively, to implement the liquid interaction method provided in the embodiments of the present disclosure.

The liquid simulation method provided in the embodiments of the present disclosure is mainly implemented by the GPU 2. The GPU 2 may implement three-dimensional liquid simulation based on initial information of the CPU 1 and a program that is stored in the memory 3 and that is in the charge of the GPU. The CPU 1 may implement liquid interaction based on output information of the GPU 2 and a corresponding program of the liquid interaction method which is stored in the memory 3 and which is in the charge of the CPU.

Figure 2:
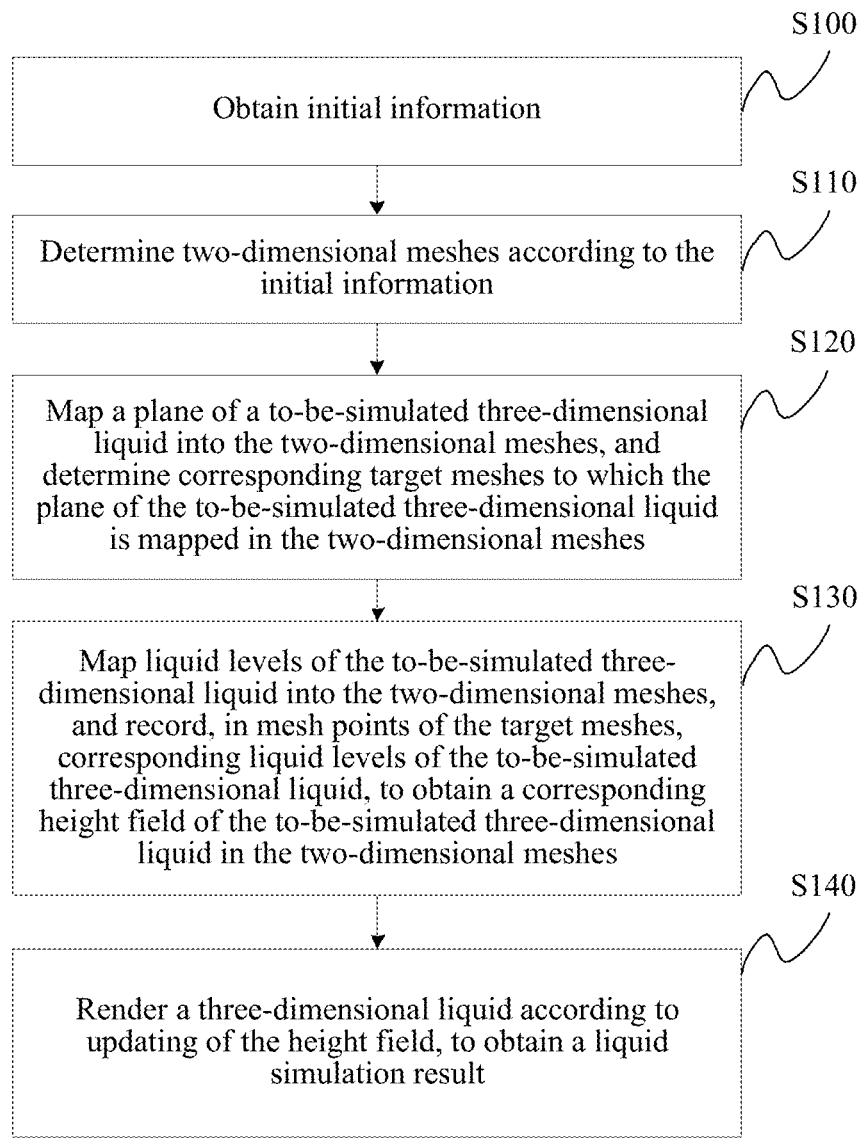
FIG. 2 is a flowchart of a liquid simulation method according to an embodiment of the present disclosure.

FIG. 2 is a flowchart of a liquid simulation method according to an embodiment of the present disclosure. The liquid simulation method may be applied to a GPU and performed by the GPU. Referring to FIG. 2, the liquid simulation method may include the followings.

S100: Obtain initial information.

Optionally, the initial information may be transmitted by a CPU to the GPU. The initial information may include: arrangement information of two-dimensional meshes corresponding to liquid simulation, for example, 2D dimensions of the two-dimensional meshes, and a side length of each mesh. Two-dimensional meshes corresponding to liquid simulation can be drawn by using the arrangement information of two-dimensional meshes.

Further, the initial information may also include: initial liquid levels corresponding to all mesh points in the two-dimensional meshes, and other parameters required in a liquid simulation process.

S110: Determine two-dimensional meshes according to the initial information.

In one embodiment of the present disclosure, two-dimensional meshes corresponding to liquid simulation may be drawn according to the arrangement information of two-dimensional meshes that is recorded in the initial information. Specifically, the two-dimensional meshes may be drawn according to the 2D dimensions of the two-dimensional meshes and the side length of each mesh.

During simulation of the three-dimensional liquid in one embodiment of the present disclosure, only two-dimensional meshes are drawn, and the simulation does not relate to three-dimensional meshes. The determined two-dimensional meshes may be considered as two-dimensional meshes corresponding to the Euler method based on spatial meshes.

S120: Map a plane of a to-be-simulated three-dimensional liquid into the two-dimensional meshes, and determine corresponding target meshes to which the plane of the to-be-simulated three-dimensional liquid is mapped in the two-dimensional meshes.

The liquid simulation method provided in one embodiment of the present disclosure is mainly used for simulating a three-dimensional liquid. After a to-be-simulated three-dimensional liquid that requires liquid simulation (such as a liquid pool that requires liquid simulation) is determined, in one embodiment of the present disclosure, a plane of the to-be-simulated three-dimensional liquid may be mapped into the two-dimensional meshes determined in S110, to determine meshes that are occupied by the plane of the to-be-simulated three-dimensional liquid in the two-dimensional meshes, thereby obtaining corresponding target meshes to which the plane of the to-be-simulated three-dimensional liquid is mapped in the two-dimensional meshes.

In one embodiment of the present disclosure, the plane of the to-be-simulated three-dimensional liquid may be considered as a bottom surface of the to-be-simulated three-dimensional liquid, and the bottom surface of the to-be-simulated three-dimensional liquid may be mapped into the two-dimensional meshes.

In one embodiment of the present disclosure, plane coordinates of the bottom surface of the to-be-simulated three-dimensional liquid may be determined. According to the plane coordinates of the bottom surface, the plane of the to-be-simulated three-dimensional liquid is mapped to an area that is in the two-dimensional meshes and that corresponds to the plane coordinates of the bottom surface. In the two-dimensional meshes, meshes occupied by the plane of the to-be-simulated three-dimensional liquid are determined, thereby obtaining corresponding target meshes to which the plane of the to-be-simulated three-dimensional liquid is mapped in the two-dimensional meshes.

Figure 3:
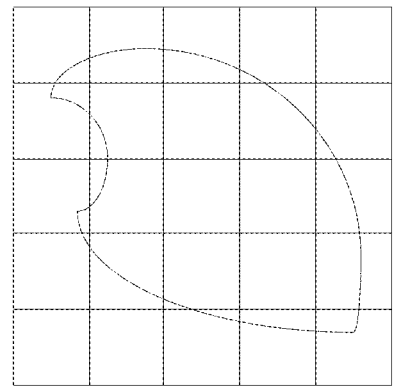
FIG. 3 is a schematic diagram of a plane of a to-be-simulated three-dimensional liquid mapped to two-dimensional meshes.

As shown in FIG. 3, a planar shape of the to-be-simulated three-dimensional liquid is shown by a curve part in the figure. After the plane of the to-be-simulated three-dimensional liquid is mapped into the two-dimensional meshes, meshes occupied by the plane of the to-be-simulated three-dimensional liquid in the two-dimensional meshes may be determined as target meshes, and there are multiple target meshes.

S130: Record, in mesh points of the target meshes, corresponding liquid levels of plane coordinates of the to-be-simulated three-dimensional liquid, to obtain a corresponding height field of the to-be-simulated three-dimensional liquid in the two-dimensional meshes.

After the target meshes occupied by the plane of the to-be-simulated three-dimensional liquid in the two-dimensional meshes are determined through S120, two-dimensional coordinates of the plane of the to-be-simulated three-dimensional liquid may be correspondingly recorded as plane coordinates of the target meshes. For liquid level information in a vertical direction of the to-be-simulated three-dimensional liquid, in one embodiment of the present disclosure, vertical-direction liquid levels, such as water heights, corresponding to different plane coordinates of the to-be-simulated three-dimensional liquid may be recorded in the mesh points of the corresponding target meshes to which the plane coordinates of the to-be-simulated three-dimensional liquid are mapped. That is, the mesh points of the target meshes can record the liquid levels corresponding to the plane coordinates of the correspondingly mapped to-be-simulated three-dimensional liquid. Therefore, coordinates of the target meshes to which the plane of the to-be-simulated three-dimensional liquid is correspondingly mapped in the two-dimensional meshes are combined with the corresponding liquid levels of the to-be-simulated three-dimensional liquid which are recorded in the mesh points of the target meshes, to obtain the height field.

It can be understood that, the height field can represent a functional relationship between the two-dimensional plane coordinates and the liquid levels of the to-be-simulated liquid.

Optionally, in one embodiment of the present disclosure, corresponding liquid levels of the plane coordinates of the to-be-simulated three-dimensional liquid corresponding to the mesh points may be recorded in the mesh points of the target meshes, thereby mapping the liquid levels of the to-be-simulated three-dimensional liquid into the two-dimensional meshes, and recording the corresponding liquid levels of the to-be-simulated three-dimensional liquid in the mesh points of the target meshes.

Figure 4:
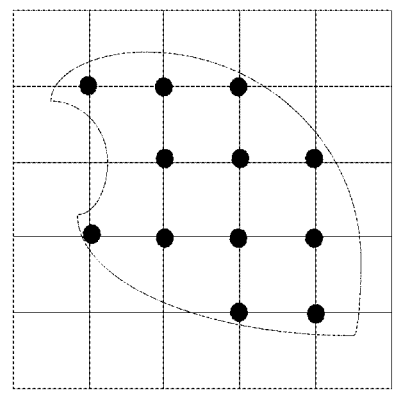
FIG. 4 is a schematic diagram of liquid levels recorded by mesh points.

As shown in FIG. 4, after the target meshes are determined, in one embodiment of the present disclosure, plane coordinates of the to-be-simulated three-dimensional liquid that correspond to the mesh points of the target meshes may be determined, and liquid levels corresponding to the plane coordinates of the to-be-simulated three-dimensional liquid are correspondingly recorded in the mesh points. For example, corresponding liquid levels are correspondingly recorded in block points in the figure. Correspondingly, the height field may be considered as a planar mesh, and a value of each mesh point in the mesh represents a height of the point.

According to the liquid simulation method provided in one embodiment of the present disclosure, by determining, in two-dimensional meshes, target meshes occupied by a plane of a to-be-simulated three-dimensional liquid and recording, in mesh points of the target meshes, liquid levels of the corresponding to-be-simulated three-dimensional liquid, simulation of the to-be-simulated three-dimensional liquid can be implemented in two-dimensional meshes in a simplified manner, thereby greatly reducing the amount of computing and reducing computational overheads, so that it is possible to simulate a liquid flowing in real time.

Figure 5:
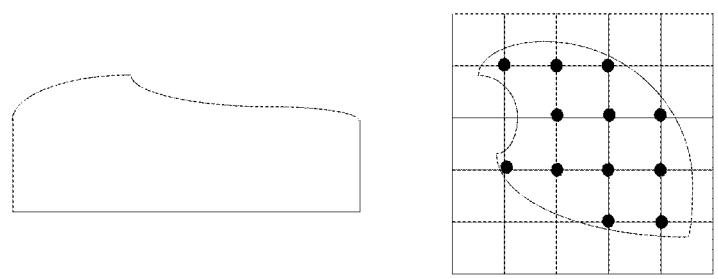
FIG. 5 is a schematic diagram of comparison between a related technology and a liquid simulation solution according to an embodiment of the present disclosure.

FIG. 5 shows a comparison between a related technology and a liquid simulation solution according to an embodiment of the present disclosure. The left part of FIG. 5 is three-dimensional liquid simulation performed by using a conventional Euler method based on spatial meshes. In the conventional Euler method based on spatial meshes, a corresponding form of a three-dimensional liquid in three-dimensional spatial meshes needs to be created, which is extremely high in computational overheads. The right part of FIG. 5 is liquid simulation performed based on the liquid simulation method provided in one embodiment of the present disclosure. Simulation of the to-be-simulated three-dimensional liquid is implemented in two-dimensional meshes in a simplified manner, and liquid levels of the corresponding to-be-simulated three-dimensional liquid are preferentially recorded in mesh points of target meshes, thereby greatly reducing computational overheads.

S140: Render a three-dimensional liquid according to updating of the height field, to obtain a liquid simulation result.

After the height field is determined through S100 to S130, the height field may be considered as an initial height field. In the liquid simulation process, the height field may be updated constantly, so that a three-dimensional liquid is rendered according to an updating result of the height field, to obtain a liquid simulation result.

In the liquid simulation method provided in one embodiment of the present disclosure, after obtaining initial information, a GPU may determine two-dimensional meshes, map a plane of a to-be-simulated three-dimensional liquid into the two-dimensional meshes, and determine corresponding target meshes to which the plane of the to-be-simulated three-dimensional liquid is mapped in the two-dimensional meshes; record, in mesh points of the target meshes, corresponding liquid levels of the to-be-simulated three-dimensional liquid, to obtain a corresponding height field of the to-be-simulated three-dimensional liquid in the two-dimensional meshes; and render a three-dimensional liquid according to updating of the height field, to obtain a liquid simulation result.

It can be understood that, according to the liquid simulation method provided in one embodiment of the present disclosure, by determining, in two-dimensional meshes, target meshes occupied by a plane of a to-be-simulated three-dimensional liquid and recording, in mesh points of the target meshes, liquid levels of the corresponding to-be-simulated three-dimensional liquid, simulation of the to-be-simulated three-dimensional liquid can be implemented in two-dimensional meshes in a simplified manner, thereby greatly reducing the amount of computing and reducing computational overheads, so that it is possible to simulate a liquid flowing in real time. Moreover, liquid simulation is implemented by using a method based on spatial meshes (that is, a three-dimensional liquid simulation method based on two-dimensional spatial meshes, which is improved from an Euler method based on spatial meshes), and can inherit a high-vividness effect brought about by liquid simulation performed based on spatial meshes, thereby reducing computational overheads of liquid simulation while ensuring vividness of a liquid simulation result.

Optionally, after the height field is determined through the process of S100 to S300, in one embodiment of the present disclosure, the height field may be updated at intervals of a preset quantity of frames, so that the three-dimensional liquid can be rendered according to an updated height field at intervals of a preset quantity of frames, to obtain the liquid simulation result.

The height field determined through the process of S100 to S130 may be considered as an initial height field of the to-be-simulated three-dimensional liquid. When the three-dimensional liquid flows or interacts with an interactive volume, a velocity of the three-dimensional liquid changes, and therefore causes the height field to change correspondingly. Therefore, after the height field is determined through the process of S100 to S130, the height field further needs to be updated at intervals of a preset quantity of frames according to flowing of the three-dimensional liquid or interaction of the three-dimensional liquid with the interactive volume.

It can be assumed that, in the liquid simulation process, S100 to S130 may be performed once, and the height field may be updated subsequently at intervals of a preset number of frames, so that the three-dimensional liquid can be rendered according to an updated height field at intervals of a preset number of frames, to obtain the liquid simulation result. Optionally, the preset number of frames may be one frame, that is, the height field is updated in each frame according to flowing of the three-dimensional liquid or interaction of the three-dimensional liquid with the interactive volume. The preset number of frames may also be a number greater than one, and may be set specifically according to an actual situation.

In one embodiment of the present disclosure, the three-dimensional liquid may be rendered according to the updated height field in combination with tessellation and vertex offset technologies at intervals of a preset number of frames.

Optionally, when the three-dimensional liquid is rendered according to the updated height field in combination with the tessellation and vertex offset technologies at intervals of a preset number of frames, in one embodiment of the present disclosure, a preset three-dimensional mesh model (Mesh, where the Mesh may be considered as a three-dimensional mesh model of an object) corresponding to the to-be-simulated three-dimensional liquid may be divided into meshes spliced by multiple triangles. In this way, vertex offset may be performed on heights of vertices of the triangles according to the height field updated at intervals of a preset number of frames, to obtain vertex positions of the triangles after the vertex offset, thereby rendering the three-dimensional liquid at intervals of a preset number of frames according to the vertex positions of the triangles after the vertex offset, to obtain the liquid simulation result.

Specifically, because the preset three-dimensional mesh model (Mesh, where the Mesh may be considered as a three-dimensional mesh model of an object) of the to-be-simulated three-dimensional liquid is merely a simple quadrangle, to further improve a vividness effect of liquid simulation, in one embodiment of the present disclosure, the Mesh corresponding to the to-be-simulated three-dimensional liquid may be dynamically divided, by using a tessellation technology, into meshes spliced by multiple triangles. In one embodiment of the present disclosure, the Mesh of the to-be-simulated three-dimensional liquid may be tessellated by using a tessellation technology provided by DirectX.

Further, according to the corresponding liquid levels of the to-be-simulated three-dimensional liquid that are recorded in the height field updated at intervals of a preset number of frames, liquid levels corresponding to the vertices of the divided triangles may be determined, so that heights of the vertices of the triangles are added to the corresponding liquid levels to implement vertex offset, thereby obtaining vertex positions of the triangles after the vertex offset. In this way, the three-dimensional liquid is rendered at intervals of a preset number of frames according to the vertex positions of the triangles after the vertex offset, to obtain the liquid simulation result.

Updating and calculation of flow information (such as a velocity and pressure) of the to-be-simulated three-dimensional liquid may be performed in a two-dimensional space by the GPU based on a hydrodynamic equation. A velocity field is updated and calculated according to the hydrodynamic equation. Therefore, based on an updated velocity field, the corresponding liquid levels of the to-be-simulated three-dimensional liquid that are recorded in the mesh points of the target meshes are updated according to a shallow water equation (SWE) formula, (that is, the height field is updated).

That is, after the to-be-simulated three-dimensional liquid is simulated in the two-dimensional meshes, a liquid level value recorded in each mesh point of the target meshes is finally updated according to the calculated flow information of the to-be-simulated three-dimensional liquid. In this way, the three-dimensional liquid can be recovered according to liquid level values of all the mesh points, thereby completing back projection from the two-dimensional meshes to the three-dimensional liquid, and implementing simulation of a flow effect of the three-dimensional liquid.

Further, in the case of interaction between an interactive volume (such as a finger of a user, a fishing rod, or other solids) and the three-dimensional liquid, the flow information (such as a velocity and pressure) of the to-be-simulated three-dimensional liquid may also be updated based on an acting force exerted by the interactive volume on the three-dimensional liquid. In addition to updating the flow information of the to-be-simulated three-dimensional liquid based on the hydrodynamic equation, the flow information of the to-be-simulated three-dimensional liquid may also be updated with reference to the acting force exerted by the interactive volume on the three-dimensional liquid, thereby updating the height field.

Optionally, apart from recording the liquid level corresponding to the mesh point, each mesh point of the target meshes may also record: flow information, such as a velocity and pressure, between the mesh point and an adjacent mesh point nearby. The flow information, such as the velocity and pressure, with the adjacent mesh point recorded by each mesh point of the target meshes may form a corresponding velocity field of the to-be-simulated three-dimensional liquid in the two-dimensional meshes.

That is, the liquid level information recorded by the mesh points of the target meshes may form the height field, and the flow information, such as velocities and pressure, recorded by the mesh points of the target meshes may form the velocity field.

Correspondingly, the height field may be updated at intervals of a preset number of frames in the following manner: updating the velocity field at intervals of a preset number of frames; and updating the height field at intervals of a preset number of frames according to an updated velocity field.

The velocity field may be updated according to a hydrodynamic equation. When there is an interactive volume interacting with the liquid, the velocity field may also be updated with reference to interaction between the interactive volume and the three-dimensional liquid.

Further, the GPU renders the three-dimensional liquid according to the height field that is updated in real time in each frame, thereby obtaining a flow simulation effect of the liquid.

If the two-dimensional meshes determined according to the initial information are more refined, the liquid simulation result is more approximate to the actual to-be-simulated liquid, but computational overheads also increase correspondingly. Therefore, an appropriate fineness level can be selected for the two-dimensional meshes, to balance the vividness of the liquid simulation result and the related computational overheads. Definitely, the fineness level of the two-dimensional meshes may be adjusted according to an actual situation.

To further reduce the computational overheads, the GPU may perform liquid simulation may using a parallel computing mechanism of a Compute Shader. With the assistance of the Compute Shader, the GPU may be used as a parallel processor, so that the GPU not only has a 3D rendering capability, but also has other computing capabilities. Optionally, the GPU may update the height field at intervals of a preset number of frames by using the Compute Shade, to further reduce the computational overheads related to liquid simulation.

Figure 6:
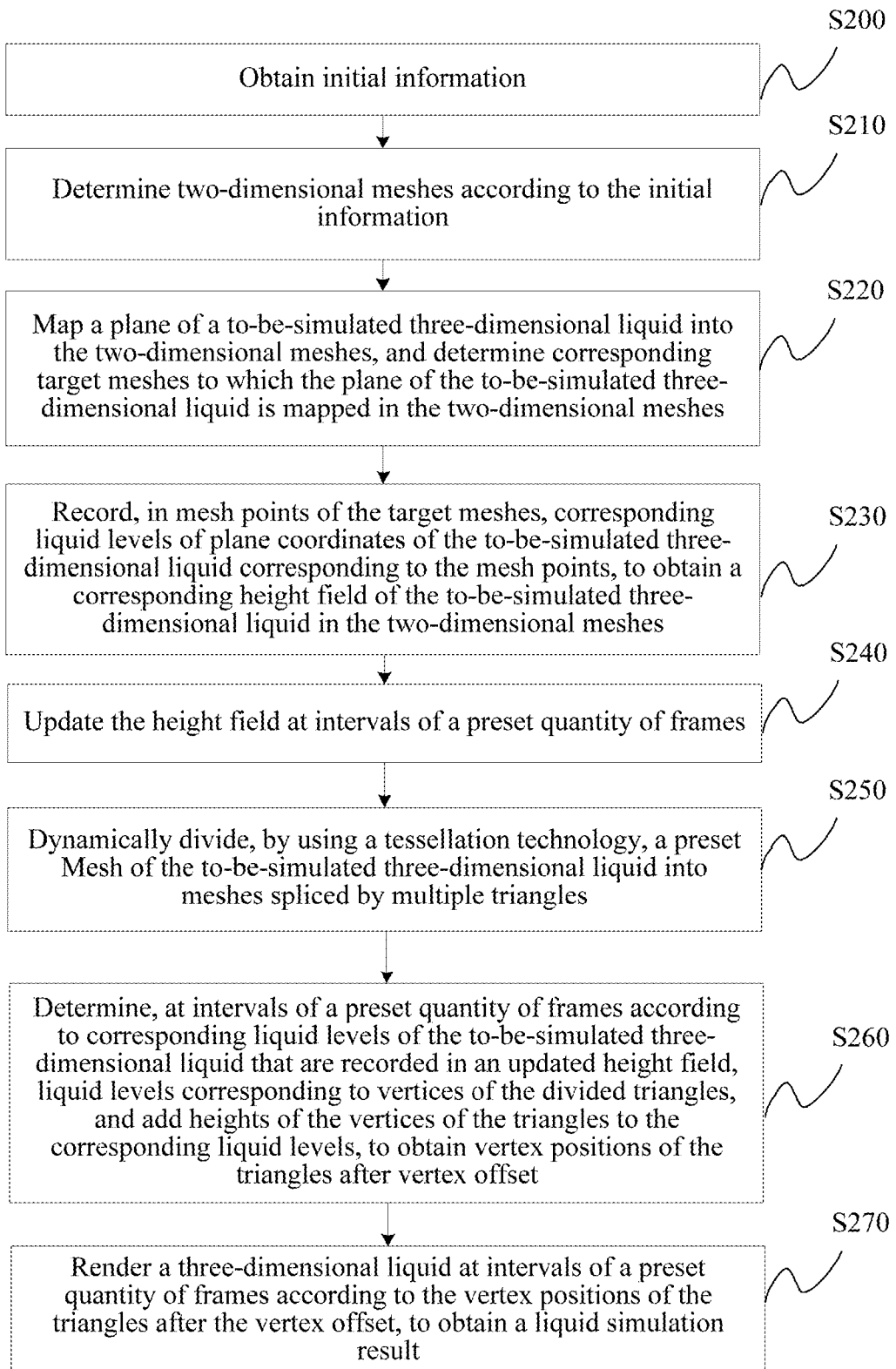
FIG. 6 is another flowchart of a liquid simulation method according to an embodiment of the present disclosure.

When the GPU performs liquid simulation, the method process shown in FIG. 6 may be used. FIG. 6 is another flowchart of a liquid simulation method according to an embodiment of the present disclosure. The liquid simulation method may be applied to a GPU and performed by the GPU. Referring to FIG. 6, the liquid simulation method may include the followings.

S200: Obtain initial information.

S210: Determine two-dimensional meshes according to the initial information.

S220: Map a plane of a to-be-simulated three-dimensional liquid into the two-dimensional meshes, and determine corresponding target meshes to which the plane of the to-be-simulated three-dimensional liquid is mapped in the two-dimensional meshes.

S230: Record, in mesh points of the target meshes, corresponding liquid levels of plane coordinates of the to-be-simulated three-dimensional liquid corresponding to the mesh points, to obtain a corresponding height field of the to-be-simulated three-dimensional liquid in the two-dimensional meshes.

S240: Update the height field at intervals of a preset number of frames.

In one embodiment of the present disclosure, a velocity field may be updated at intervals of a preset number of frames, thereby updating the height field at intervals of a preset number of frames according to an updated velocity field.

The velocity field may be updated according to a hydrodynamic equation. When there is an interactive volume interacting with the liquid, the velocity field may further be updated with reference to interaction between the interactive volume and the three-dimensional liquid. The content about updating the velocity field with reference to interaction between the interactive volume and the three-dimensional liquid will be described in the content of the liquid interaction method in the followings.

S250: Dynamically divide, by using a tessellation technology, a preset Mesh of the to-be-simulated three-dimensional liquid into meshes spliced by multiple triangles.

S260: Determine, at intervals of a preset number of frames according to corresponding liquid levels of the to-be-simulated three-dimensional liquid that are recorded in an updated height field, liquid levels corresponding to vertices of the divided triangles, and add heights of the vertices of the triangles to the corresponding liquid levels, to obtain vertex positions of the triangles after vertex offset.

S270: Render a three-dimensional liquid at intervals of a preset number of frames according to the vertex positions of the triangles after the vertex offset, to obtain a liquid simulation result.

S240 to S270 may be considered as an optional implementation of S140 in FIG. 2, and the present disclosure does not exclude other manners for rendering a three-dimensional liquid according to a height field that is updated at intervals of a preset number of frames. For example, an initial three-dimensional liquid is first rendered according to an updated height field at intervals of a preset number of frames. Liquid levels of the three-dimensional liquid correspond to the corresponding liquid levels of the to-be-simulated three-dimensional liquid that are recorded by the mesh points of the target meshes in the height field. Then, according to heights of vertices of triangles subdivided from a preset Mesh of the to-be-simulated three-dimensional liquid, the corresponding liquid levels of the vertices in the initial three-dimensional liquid are adjusted at intervals of a preset number of frames, thereby rendering the three-dimensional liquid.

Optionally, while implementing liquid simulation, the present disclosure can further implement interaction between an interactive volume and a liquid. The interactive volume may be, for example, a solid interacting with the liquid, or an object with which a user operates the liquid. In this way, the user can have a vivid interaction experience based on a liquid simulation result with high vividness and low computational overheads.

Figure 7A:
FIG. 7A is an exemplary diagram of a liquid simulation effect according to an embodiment of the present disclosure.
Figure 7B:
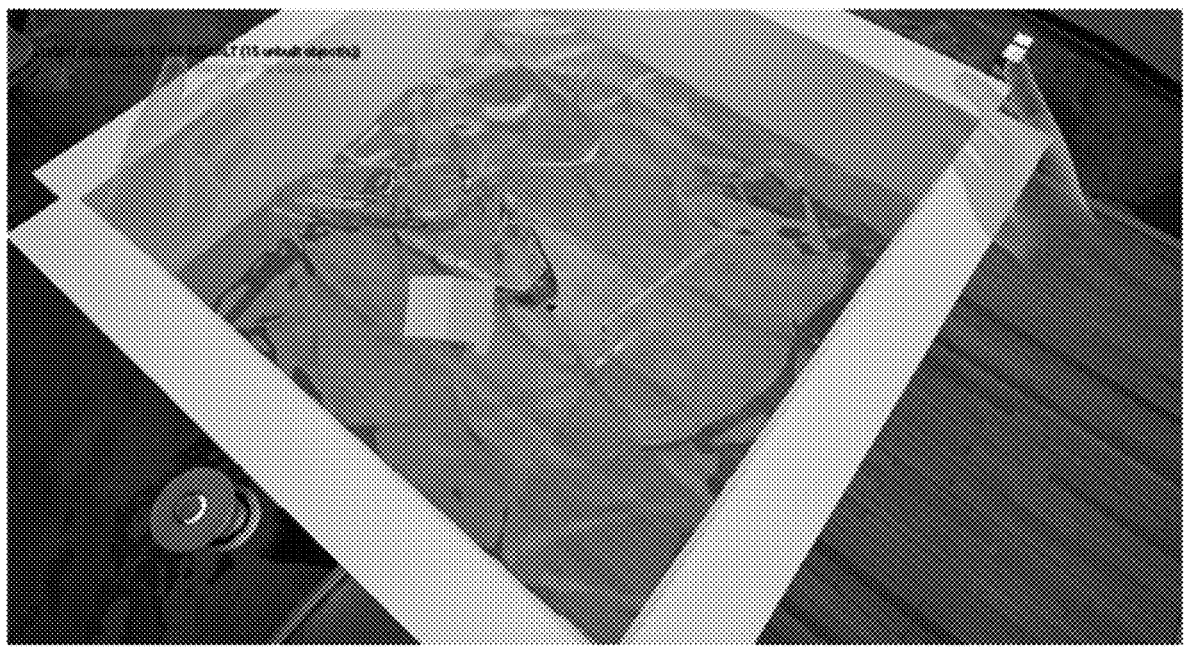
FIG. 7B is another exemplary diagram of a liquid simulation effect according to an embodiment of the present disclosure.

Using the liquid being water as an example, FIG. 7A and FIG. 7B show a water simulation effect of a water pool and interaction with a user. The user may create waves on the surface of the water or even stir water of the whole pool. A white cube floating on the surface of the water goes up and down with the waves and drifts back and forth. As can be seen, water simulation performed based on one embodiment of the present disclosure achieves a delicate and real water surface effect.

Figure 7C:
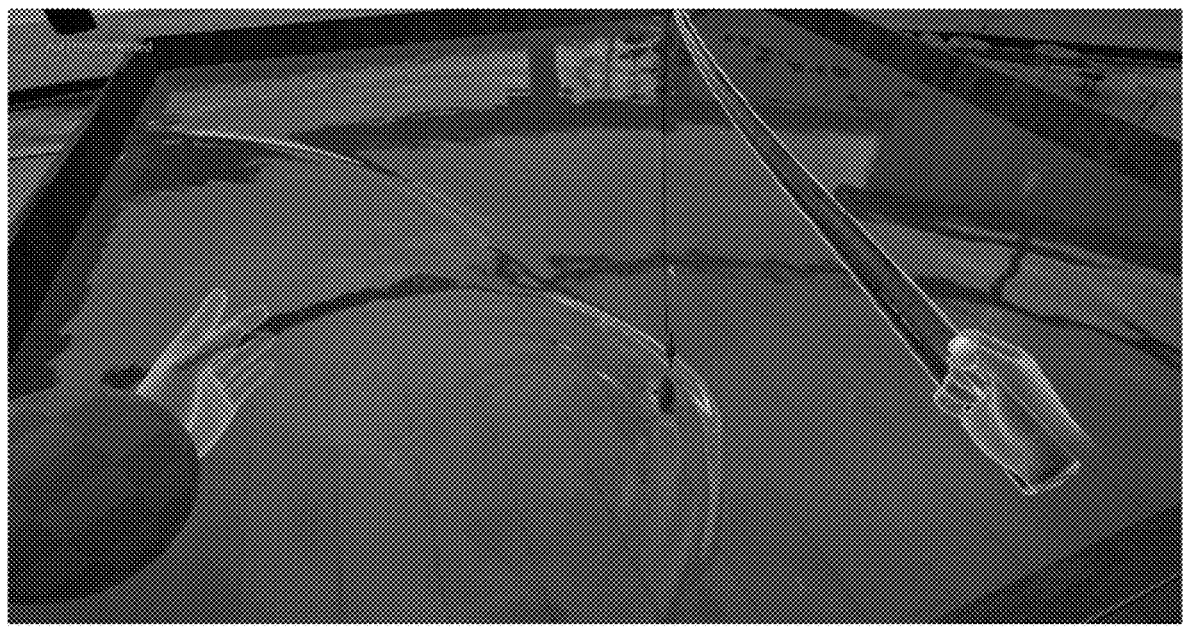
FIG. 7C is another exemplary diagram of a liquid simulation effect according to an embodiment of the present disclosure.

FIG. 7C shows a fishing game created based on the liquid simulation method provided in one embodiment of the present disclosure. It can be seen that, the water simulation effect achieved by one embodiment of the present disclosure is highly real, and the real water surface effect can improve the feeling of immersion of the user.

By testing, in the examples shown in FIG. 7A, FIG. 7B, and FIG. 7C, water simulation performed based on one embodiment of the present disclosure only takes approximately 0.5 ms at the CPU side and the GPU side each. In consideration of the highly vivid water surface effect, computing time overheads of one embodiment of the present disclosure are extremely low.

In one embodiment of the present disclosure, to implement liquid interaction, an interaction force between the three-dimensional liquid and the interactive volume (for example, an acting force exerted by the three-dimensional liquid on the interactive volume, or an acting force exerted by the interactive volume on the three-dimensional liquid) needs to be calculated. In one embodiment of the present disclosure, the interaction force between the three-dimensional liquid and the interactive volume may be calculated by the CPU, so as to reduce computational overheads of the GPU. The GPU may display a liquid interaction effect based on the interaction force between the three-dimensional liquid and the interactive volume calculated by the CPU.

Figure 8:
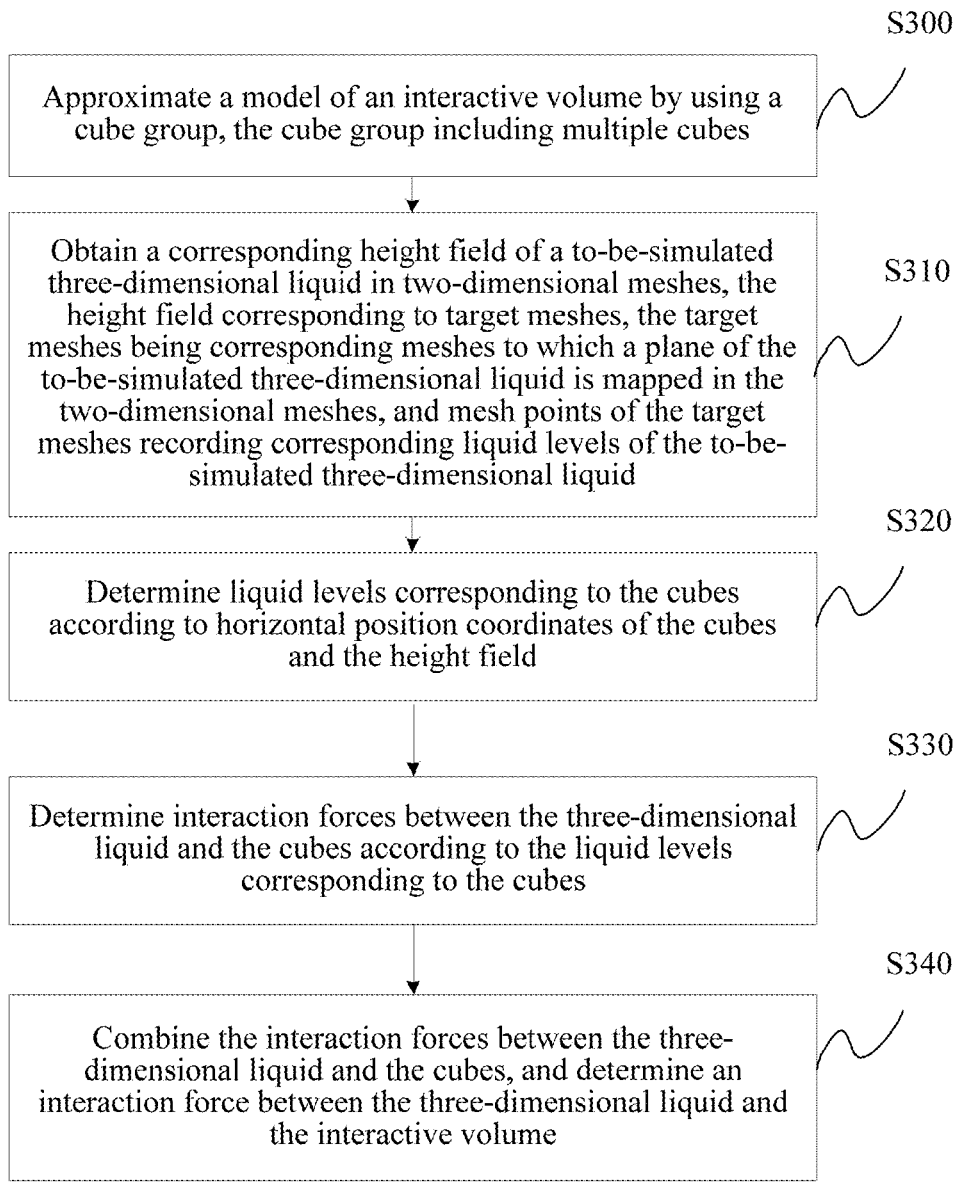
FIG. 8 is a flowchart of a liquid interaction method according to an embodiment of the present disclosure.

FIG. 8 is a flowchart of a liquid interaction method according to an embodiment of the present disclosure. In this liquid interaction method, a process of computing an interaction force between a three-dimensional liquid and an interactive volume is mainly described. The liquid interaction method may be applied to a CPU and performed by the CPU. Referring to FIG. 8, the method may include the followings.

S300: Approximate a model of an interactive volume by using a cube group, the cube group including multiple cubes.

During determining of the interaction force between the three-dimensional liquid and the interactive volume in the liquid interaction method, a problem first needing to be resolved is to determine a format into which the interactive volume is abstracted. In a conventional liquid interaction method, an interactive volume is mainly represented by using a surface Mesh of the interactive volume directly, and then for each triangle on the surface Mesh of the interactive volume, an interaction force between the interactive volume and the three-dimensional liquid is calculated, thereby determining the interaction force between the three-dimensional liquid and the interactive volume. However, such a method of representing an interactive volume by using a surface Mesh of the interactive volume involves high computational overheads, and is not applicable to scenarios with a high requirement on real-time performance, such as a computer game scenario.

Therefore, an improvement solution is proposed in one embodiment of the present disclosure. A cube group (where the cube group may include multiple cubes) is used to approximately represent an interactive volume, thereby avoiding high computational overheads that are consumed during calculation of an interaction force between an interactive volume and a three-dimensional liquid in the conventional method because the interactive volume is represented by using a surface Mesh of the interactive volume and calculation is performed for each triangle on the surface Mesh of the interactive volume.

In one embodiment of the present disclosure, the interactive volume may be approximated by using the cube group in the following manner: dividing a surrounding space of the model of the interactive volume into three-dimensional meshes, where optionally, the length, width, and height of the three-dimensional meshes is required to be able to contain the interactive volume; determining, for each mesh point in the three-dimensional meshes, whether the mesh point is located inside the model of the interactive volume; if yes, generating a cube corresponding to the mesh point at the mesh point; otherwise, ignoring the mesh point. In this way, mesh points that are located inside the model of the interactive volume can be determined in the three-dimensional meshes, and a cube group approximate to the model of the interactive volume is generated according to cubes corresponding to the mesh points that are located inside the model of the interactive volume.

Correspondingly, in one embodiment of the present disclosure, all cubes included in the interactive volume, a side length of each cube, and a relative position of each cube in the interactive volume can be determined.

Further, to display the interactive volume in a liquid simulation result, the CPU may transmit, to a GPU, information of the cube group used for approximating the interactive volume, so that the GPU displays the interactive volume in the liquid simulation result. The information of the cube group may include: a side length of each cube, a relative position of each cube with respect to the model of the interactive volume, and the like.

S310: Obtain a corresponding height field of a to-be-simulated three-dimensional liquid in two-dimensional meshes, the height field corresponding to target meshes, the target meshes being corresponding meshes to which a plane of the to-be-simulated three-dimensional liquid is mapped in the two-dimensional meshes, and mesh points of the target meshes recording corresponding liquid levels of the to-be-simulated three-dimensional liquid.

Further, the mesh points of the target meshes may record corresponding liquid levels of plane coordinates of the to-be-simulated three-dimensional liquid corresponding to the mesh points.

The height field may be determined by the GPU according to the liquid simulation method provided above. After determining the height field, the GPU may feed the height field back to the CPU, so that the CPU calculates the interaction force between the three-dimensional liquid and the interactive volume.

S320: Determine liquid levels corresponding to the cubes according to horizontal position coordinates of the cubes and the height field.

The height field may represent a functional relationship between two-dimensional plane coordinates and liquid levels of the to-be-simulated liquid. Spatial position coordinates of the cubes are already known. By substituting horizontal position coordinates in the spatial position coordinates of the cubes into the functional relationship represented by the height field, corresponding liquid levels of the horizontal position coordinates of the cubes can be obtained, thereby obtaining liquid levels corresponding to the cubes.

It may be assumed that the functional relationship represented by the height field is $f(x, y) \rightarrow z$, that is, a corresponding liquid level can be determined according to horizontal coordinates x and y. It is assumed that spatial position coordinates of a cube is $(x, y, z)$; then, by substituting the horizontal position coordinates x and y in the spatial position coordinates of the cube into the functional relationship $f(x, y) \rightarrow z$, a liquid level corresponding to the cube can be obtained.

S330: Determine interaction forces between the to-be-simulated three-dimensional liquid and the cubes according to the liquid levels corresponding to the cubes.

S340: Combine the interaction forces between the to-be-simulated three-dimensional liquid and the cubes, and determine an interaction force between the to-be-simulated three-dimensional liquid and the interactive volume.

Optionally, for each cube, it is assumed that a central spatial coordinate of the cube is p. After the interaction force between the cube and the three-dimensional liquid is calculated, the interaction force with the three-dimensional liquid can be directly determined at a relative position of p on the model of the interactive volume to which the cube belongs. For a process of determining an interaction force at a specified point, a function interface is generally provided in a physical engine, and the function interface may be directly invoked herein. The interaction forces between the three-dimensional liquid and the cubes are combined, which means that after such an operation is performed on all the cubes, interaction forces between different positions of the model of the interactive volume and the three-dimensional liquid can be obtained, so that a liquid interaction effect can be determined according to the interaction forces.

That is, in one embodiment of the present disclosure, according to interaction forces with the three-dimensional liquid that correspond to the central spatial coordinates of the cubes, corresponding interaction forces with the three-dimensional liquid at positions that are in the model of the interactive volume and that correspond to the central spatial coordinates of the cubes are determined, thereby obtaining the interaction force between the three-dimensional liquid and the interactive volume.

For example, during determining of acting forces exerted by the three-dimensional liquid on the cubes, in one embodiment of the present disclosure, a corresponding force applied by the three-dimensional liquid on the central spatial coordinate of each cube can be determined, thereby determining a corresponding force applied by the three-dimensional liquid at a position that is in the model of the interactive volume and that corresponds to the central spatial coordinate of each cube, so as to obtain a group of forces applied by the three-dimensional liquid on different positions of the model of the interactive volume, that is, obtain the acting force exerted by the three-dimensional liquid on the interactive volume. A principle for determining an acting force exerted by the interactive volume on the three-dimensional liquid is similar to the principle described above.

Optionally, after determining the interaction force between the three-dimensional liquid and the interactive volume, the CPU may further determine an interaction impact result between the three-dimensional liquid and the interactive volume according to the interaction force between the three-dimensional liquid and the interactive volume, and transmit the interaction impact result to the GPU. The GPU displays an interaction result between the three-dimensional liquid and the interactive volume according to the interaction impact result between the three-dimensional liquid and the interactive volume.

For example, after determining the acting force exerted by the three-dimensional liquid on the interactive volume, the CPU may further determine an impact result of the interactive volume under the effect of the three-dimensional liquid, and transmit the impact result to the GPU. The GPU displays an interaction result between the three-dimensional liquid and the interactive volume.

After the acting force exerted by the interactive volume on the three-dimensional liquid is determined, the GPU may update a velocity field, further update the height field, and update a simulation result of the three-dimensional liquid.

Optionally, after the liquid levels corresponding to the cubes are determined, in one embodiment of the present disclosure, immersion depths of the cubes in the three-dimensional liquid may be determined correspondingly, so that interaction forces between the three-dimensional liquid and the cubes are determined according to the immersion depths of the cubes in the three-dimensional liquid.

Figure 9:
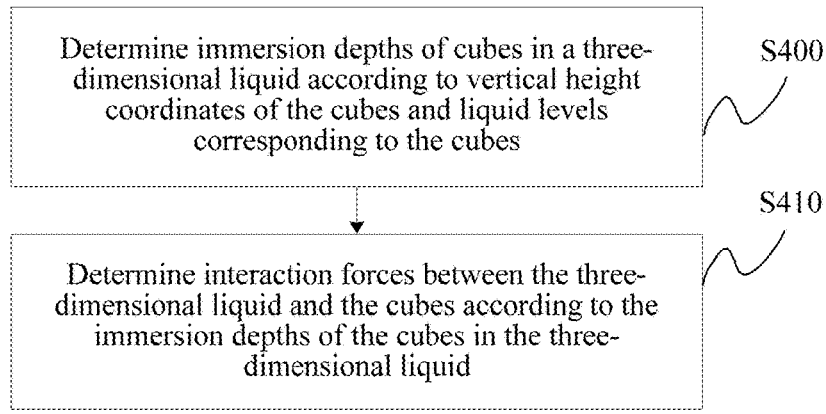
FIG. 9 is a flowchart of a method for determining interaction forces between a three-dimensional liquid and cubes.

Correspondingly, FIG. 9 is a flowchart of a method for determining interaction forces between a three-dimensional liquid and cubes according to an embodiment of the present disclosure. The method may be applied to a CPU. Referring to FIG. 9, the method may include the followings.

S400: Determine immersion depths of cubes in a three-dimensional liquid according to vertical height coordinates of the cubes and liquid levels corresponding to the cubes.

In one embodiment of the present disclosure, bottom surface heights of the cubes may be determined according to the vertical height coordinates of the cubes and heights of the cubes. Then, the immersion depths of the cubes in the three-dimensional liquid can be obtained by subtracting the bottom surface heights from the liquid levels corresponding to the cubes.

S410: Determine interaction forces between the three-dimensional liquid and the cubes according to the immersion depths of the cubes in the three-dimensional liquid.

In one embodiment of the present disclosure, immersion volumes of the cubes in the three-dimensional liquid may be determined according to the immersion depths of the cubes in the three-dimensional liquid, thereby determining the interaction forces between the three-dimensional liquid and the cubes according to the immersion volumes of the cubes in the three-dimensional liquid, speeds of the cubes, and a speed of the three-dimensional liquid.

Optionally, the interaction forces between the three-dimensional liquid and the cubes may be represented by acting forces exerted by the three-dimensional liquid on the cubes, and acting forces exerted by the cubes on the three-dimensional liquid.

Figure 10:
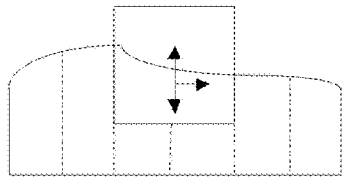
FIG. 10 is a schematic diagram of an acting force exerted on a cube by a three-dimensional liquid.

For a cube, an acting force exerted by the three-dimensional liquid on the cube may be represented by buoyancy and resistance exerted by the three-dimensional liquid on the cube. In one embodiment of the present disclosure, an immersion volume of the cube in the three-dimensional liquid may be determined according to an immersion depth of the cube in the three-dimensional liquid; then, buoyancy and resistance exerted by the three-dimensional liquid on the cube are calculated according to the immersion volume of the cube in the three-dimensional liquid, a speed of the cube, and the speed of the three-dimensional liquid, to obtain an acting force exerted by the three-dimensional liquid on the cube. As shown in FIG. 10, the block shown in FIG. 10 represents a cube, the wavelike pattern represents a three-dimensional liquid, an area separated by a virtual arrow corresponds to a mesh point, and the arrow represents an acting force exerted by the three-dimensional liquid on the cube.

During calculation of the acting forces exerted by the cubes on the three-dimensional liquid, for each cube, an immersion volume of the cube in the three-dimensional liquid may be determined according to the immersion depths of the cube in the three-dimensional liquid, thereby calculating an acting force exerted by the cube on the three-dimensional liquid according to the immersion volume of the cube in the three-dimensional liquid, and a speed of the cube relative to the three-dimensional liquid. The relative speeds of the cubes with respect to the three-dimensional liquid may be determined based on the speed of the three-dimensional liquid and the speeds of the cubes. The speed of the three-dimensional liquid may be determined according to a velocity field transmitted by the GPU (correspondingly, the CPU may further obtain the velocity field transmitted by the GPU, where the velocity field correspond to target meshes, the target meshes are corresponding meshes to which a plane of the to-be-simulated three-dimensional liquid is mapped in the two-dimensional meshes, and each mesh point of the target meshes records a relative velocity with respect to an adjacent mesh point), and the speeds of the cubes are calculated by physical engine. The physical engine is, for example, PhysX.

Figure 11:
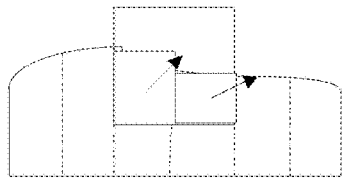
FIG. 11 is a schematic diagram of an acting force exerted on a three-dimensional liquid by a cube.

As shown in FIG. 11, the block represents a cube, and an area separated by a virtual arrow corresponds to a mesh point. In this case, the cube occupies two mesh points. An acting force exerted by the cube on the three-dimensional liquid needs to be calculated according to respective immersion depths of the cube on the two mesh points and a speed relative to the three-dimensional liquid. The acting force exerted by the cube on the three-dimensional liquid is shown by the arrows in FIG. 11.

Figure 12:
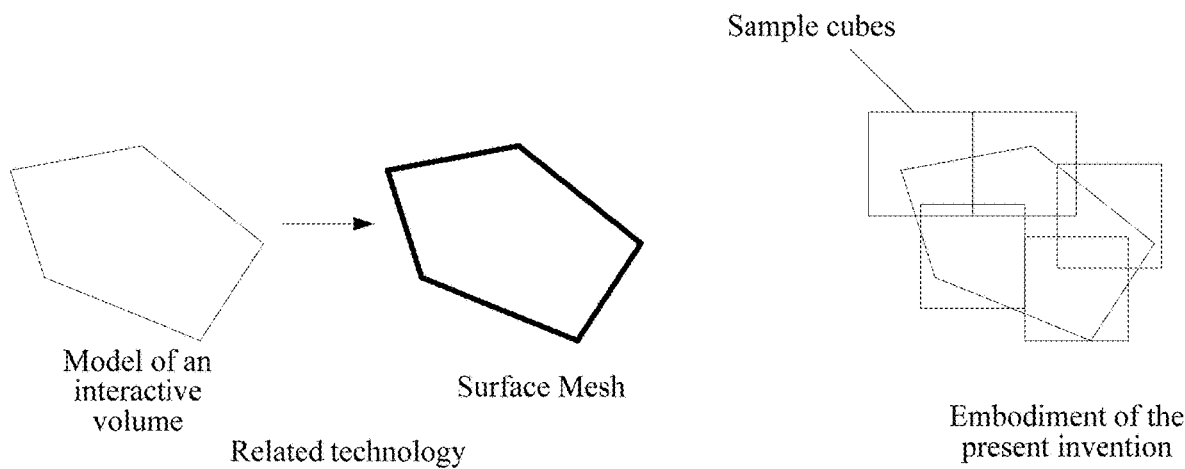
FIG. 12 is a schematic diagram of a comparison between a related technology and a liquid interaction solution according to an embodiment of the present disclosure.

As shown in FIG. 12, unlike the method of representing an interactive volume by using a surface Mesh of the interactive volume and then calculate, where an interaction force with the three-dimensional liquid is calculated for each triangle on the surface Mesh of the interactive volume, in one embodiment of the present disclosure, cubes can be sampled on a model of an interactive volume, and then an interaction force with the three-dimensional liquid is determined by using subdivided cubes. Compared with calculating an interaction force between the whole surface Mesh and the three-dimensional liquid, this approach may greatly reduce computational overheads.

The acting forces exerted by the cubes on the three-dimensional liquid may affect a movement state of the three-dimensional liquid. Therefore, in one embodiment of the present disclosure, the CPU may transmit the relative speeds of the cubes with respect to the three-dimensional liquid and the immersion depths of the cubes in the three-dimensional liquid to the GPU in the process of calculating the interaction forces between the cubes and the three-dimensional liquid. The GPU updates the velocity field according to the elative speeds of the cubes with respect to the three-dimensional liquid and the immersion depths of the cubes in the three-dimensional liquid, that is, the GPU updates relative velocities recorded in the mesh points of the target meshes corresponding to the cubes.

Further, a corresponding liquid level may be recorded in each mesh point of the target meshes corresponding to the height field, and a relative velocity with respect to an adjacent mesh point may be recorded in each mesh point of the target meshes corresponding to the velocity field.

Based on the information transmitted from the CPU, the GPU determine a relative speed of each sampled cube in the model of the interactive volume with respect to the three-dimensional liquid and the immersion depth of the cube in the three-dimensional liquid. After that, for each cube, the GPU may multiply the relative speed of the cube with respect to the three-dimensional liquid by a specified coefficient, add a multiplying result to a relative velocity in the velocity field which is recorded by a mesh point of the target meshes that corresponds to the cube, and record an addition result in the mesh point of the target meshes that corresponds to the cube, so as to update the relative velocity in the velocity field which is recorded by the mesh point of the target meshes that corresponds to the cube. The specified coefficient is related to the immersion depth of the cube in the three-dimensional liquid.

Correspondingly, the GPU may update the height field according to updated relative velocities in an updated velocity field that are recorded in the mesh points of the target meshes, that is, the GPU may update liquid levels in the height field that are correspondingly recorded in the mesh points of the target meshes. For example, the updated relative velocities recorded in the mesh points of the target meshes may be substituted into an SWE formula, to calculate liquid levels correspondingly recorded in the mesh points of the target meshes, thereby determining impact of the interactive volume on the movement state of the three-dimensional liquid.

A core formula of the SWE represents mutual impact between a liquid level and a velocity. That is, a change in the liquid level is affected by the velocity, and a change in the velocity is also affected by a value of the liquid level. For example, relative velocities of a mesh point and an adjacent mesh point both flow out from said mesh point. In this case, a higher outflow speed indicates a higher descent speed of the liquid level of the mesh point. The outflow speed is further correlated to a height difference between the mesh point and the adjacent mesh point, and a greater height difference indicates a higher outflow speed. That is, the SWE formula represents the following relationship between a liquid level and a relative velocity: a change rate of a liquid level recorded by a mesh point is in a negative correlation with an outflow speed reflected by a recorded relative velocity with respect to an adjacent mesh point, and an outflow speed reflected by a relative velocity, which is recorded by a mesh point, with respect to an adjacent mesh point is in a positive correlation with a height difference between a liquid level recorded by the mesh point and a liquid level recorded by the adjacent mesh point.

Further, the GPU may update liquid simulation based on an updated height field, to update the liquid simulation result.

Optionally, the process in which the GPU updates the velocity field and the height field and process in which the GPU determines the liquid simulation result may be implemented through parallel processing based on a parallel computing mechanism provided by Compute Shader.

The liquid simulation method provided in one embodiment of the present disclosure described above is mainly implemented by the GPU. Calculation of the interaction force between the interactive volume and the three-dimensional liquid in the liquid interaction method is implemented by the CPU.

Because the interactive volume is sensitive to applied forces, in general cases, a latest acting force needs to be obtained in each frame. If the interaction force between the interactive volume and the three-dimensional liquid is calculated at the GPU end, the GPU needs to return data such as a height field to the CPU in each frame, thus causing high computational overheads at the CPU end and wasting time. Therefore, the interaction force between the interactive volume and the three-dimensional liquid (for example, a force applied on the interactive volume) may be calculated at the CPU end in each frame, and the GPU transmits liquid data, such as a latest height field, to the CPU at intervals of several frames, so that the CPU calculates the interaction force between the interactive volume and the three-dimensional liquid. The GPU does not need to return liquid data in each frame, because the liquid height and speed do not change significantly within a period of several frames. Therefore, a force applied on a solid may be calculated using previous liquid data.

Figure 13:
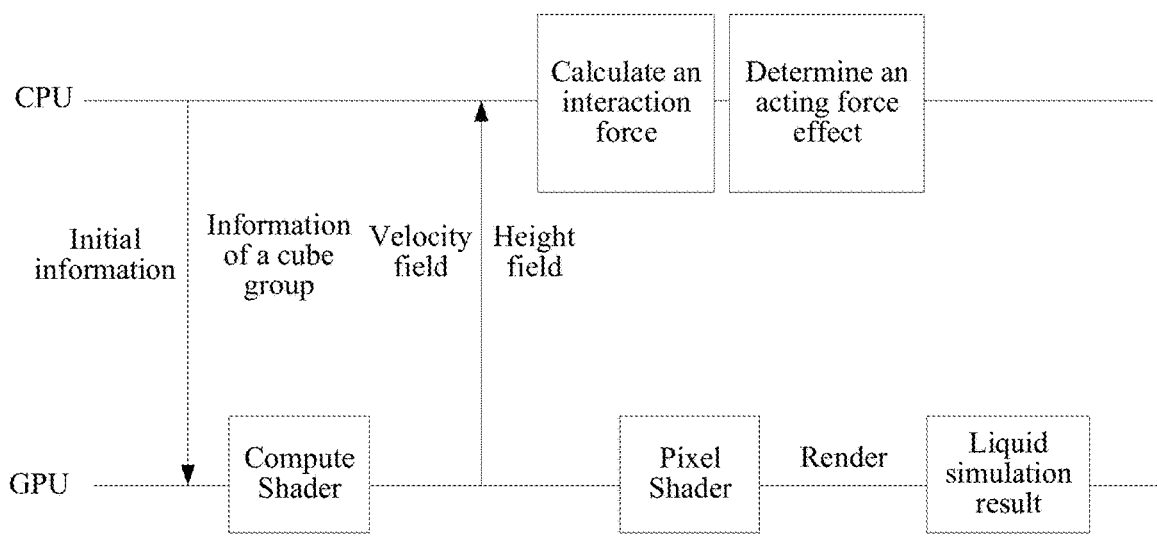
FIG. 13 is a schematic diagram of processing directions of a CPU and a GPU according to an embodiment of the present disclosure.

Correspondingly, in the liquid simulation method and the liquid interaction method provided in the embodiments of the present disclosure, related CPU and GPU processing directions may be as shown in FIG. 13. The CPU may transmit, to the GPU, initial information and information of a cube group for approximating an interactive volume. The GPU may update a height field and a velocity field by using a Compute Shader, and transmit the height field and the velocity field to the CPU. The CPU performs the liquid interaction method provided in one embodiment of the present disclosure based on the height field, the velocity field, and a model of the interactive volume, and calculates an interaction force between the interactive volume and a three-dimensional liquid. Meanwhile, the GPU may perform rendering based the updated height field by using a Pixel Shader, to obtain a liquid simulation result, and render the interactive volume in the liquid simulation result.

In the liquid simulation method provided in one embodiment of the present disclosure, the GPU may perform parallel processing by using a Compute Shader, to implement simulation of a to-be-simulated three-dimensional liquid in two-dimensional meshes in a simplified manner, thereby greatly reducing the amount of computing and reducing computational overheads, so that it is possible to simulate a liquid flowing in real time. Moreover, liquid simulation implemented by using a method based on spatial meshes can inherit a high-vividness effect brought about by liquid simulation performed based on spatial meshes, thereby reducing computational overheads of liquid simulation while ensuring vividness of a liquid simulation result.

Moreover, in the liquid interaction method provided in one embodiment of the present disclosure, the CPU may calculate an interaction force between a three-dimensional liquid and an interactive volume based on a height field by using a cube group approximate to a model of the interactive volume, thereby reducing overheads of computing the interaction force between the three-dimensional liquid and the interactive volume in the liquid interaction method. Besides, the GPU may update a velocity field according to relative speeds of cubes with respect to the three-dimensional liquid and immersion depths of the cubes in the three-dimensional liquid, thereby updating the height field based on an updated velocity field by using an SWE formula, so that the GPU can update a liquid simulation result in real time based on the height field updated in real time.

The following describes a liquid simulation apparatus provided in an embodiment of the present disclosure. The liquid simulation apparatus described in the following may be considered as program modules that need to be configured in a GPU to implement the liquid simulation method provided in the embodiment of the present disclosure. The liquid simulation apparatus described below and the liquid simulation method described above may be referenced to each other.

Figure 14:
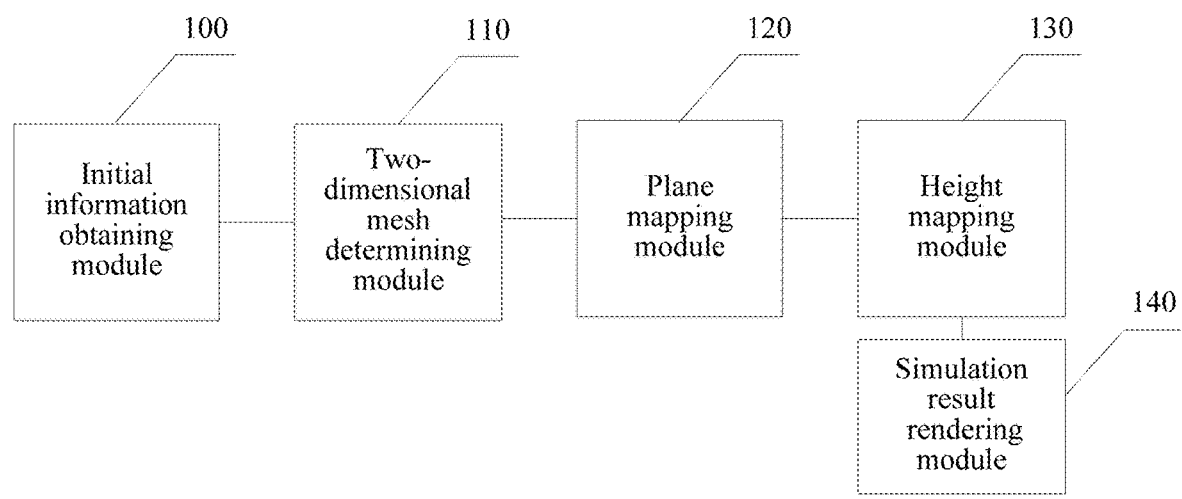
FIG. 14 is a structural block diagram of a liquid simulation apparatus according to an embodiment of the present disclosure.

FIG. 14 is a structural block diagram of a liquid simulation apparatus according to an embodiment of the present disclosure. The liquid simulation apparatus may be applied to a GPU. Referring to FIG. 14, the liquid simulation apparatus may include: an initial information obtaining module 100, a two-dimensional mesh determining module 110, a plane mapping module 120, a height mapping module 130, and a simulation result rendering module 140.

The initial information obtaining module 100 is configured to obtain initial information. The two-dimensional mesh determining module 110 is configured to determine two-dimensional meshes according to the initial information.

The plane mapping module 120 is configured to map a plane of a to-be-simulated three-dimensional liquid into the two-dimensional meshes, and determine corresponding target meshes to which the plane of the to-be-simulated three-dimensional liquid is mapped in the two-dimensional meshes.

The height mapping module 130 is configured to record, in mesh points of the target meshes, corresponding liquid levels of plane coordinates of the to-be-simulated three-dimensional liquid, to obtain a corresponding height field of the to-be-simulated three-dimensional liquid in the two-dimensional meshes.

The simulation result rendering module 140 is configured to render a three-dimensional liquid according to updating of the height field, to obtain a liquid simulation result.

Specifically, the simulation result rendering module 140 may be configured to update the height field at intervals of a preset number of frames; and render the three-dimensional liquid according to an updated height field at intervals of a preset number of frames, to obtain the liquid simulation result.

Optionally, to map liquid levels of the to-be-simulated three-dimensional liquid into the two-dimensional meshes and record, in mesh points of the target meshes, the corresponding liquid levels of the to-be-simulated three-dimensional liquid, the height mapping module 130 may be configured to record, in the mesh points of the target meshes, corresponding liquid levels of plane coordinates of the to-be-simulated three-dimensional liquid which correspond to the mesh points.

Optionally, render the three-dimensional liquid according to an updated height field at intervals of a preset number of frames, the simulation result rendering module 140 may be configured to divide a Mesh corresponding to the to-be-simulated three-dimensional liquid into meshes spliced by multiple triangles; perform vertex offset on heights of vertices of the triangles according to the updated height field at intervals of a preset number of frames, to obtain vertex positions of the triangles after the vertex offset; and render the three-dimensional liquid according to the vertex positions of the triangles after the vertex offset at intervals of a preset number of frames, to obtain the liquid simulation result.

Optionally, to divide a Mesh corresponding to the to-be-simulated three-dimensional liquid into meshes spliced by multiple triangles, the simulation result rendering module 140 may be configured to dynamically divide the Mesh corresponding to the to-be-simulated three-dimensional liquid into the meshes spliced by the multiple triangles by using a tessellation technology.

Optionally, to perform vertex offset on heights of vertices of the triangles according to the updated height field, the simulation result rendering module 140 may be configured to determine, according to corresponding liquid levels of the to-be-simulated three-dimensional liquid that are recorded in the height field updated at intervals of a preset number of frames, liquid levels corresponding to the vertices of the divided triangles; and add heights of the vertices of the triangles with the corresponding liquid levels, to obtain the vertex positions of the triangles after the vertex offset.

Optionally, to map a plane of a to-be-simulated three-dimensional liquid into the two-dimensional meshes, and determine corresponding target meshes to which the plane of the to-be-simulated three-dimensional liquid is mapped in the two-dimensional meshes, the plane mapping module 120 may be configured to determine plane coordinates of a bottom surface of the to-be-simulated three-dimensional liquid; mapping, according to the plane coordinates of the bottom surface, the plane of the to-be-simulated three-dimensional liquid to an area that is in the two-dimensional meshes and that corresponds to the plane coordinates of the bottom surface; and determining meshes occupied by the plane of the to-be-simulated three-dimensional liquid in the two-dimensional meshes, to obtain the corresponding target meshes to which the plane of the to-be-simulated three-dimensional liquid is mapped in the two-dimensional meshes.

Figure 15:
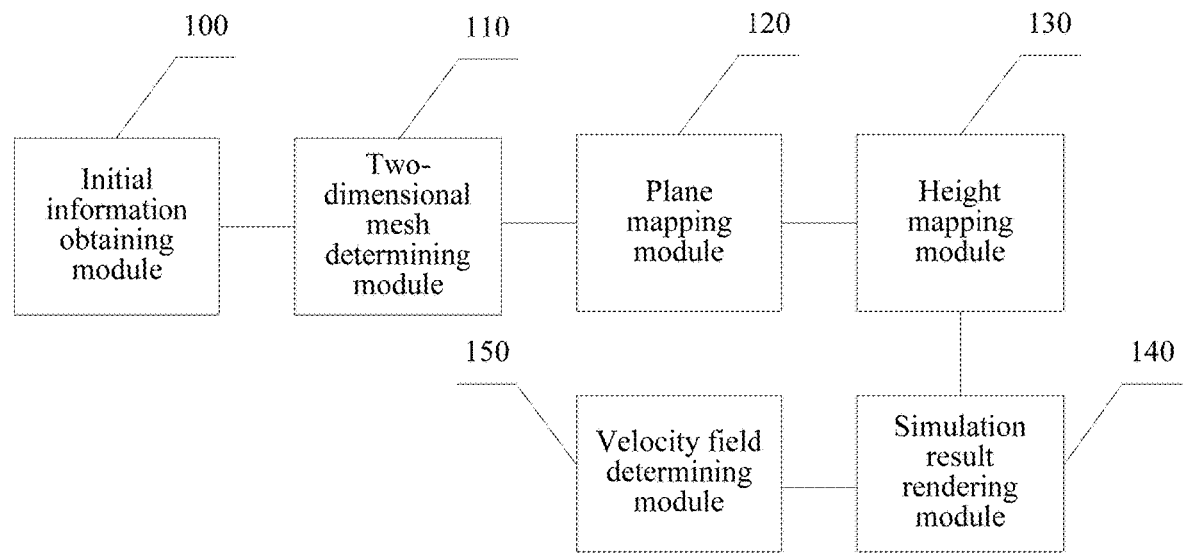
FIG. 15 is another structural block diagram of a liquid simulation apparatus according to an embodiment of the present disclosure.

FIG. 15 is another structural block diagram of a liquid simulation apparatus according to an embodiment of the present disclosure. With reference to FIG. 14 and FIG. 15, the liquid simulation apparatus may further include a velocity field determining module 150.

The velocity field determining module 150 is configured to determine flow information between mesh points of the target meshes and adjacent mesh points nearby, to obtain a corresponding velocity field of the to-be-simulated three-dimensional liquid in the two-dimensional meshes, the flow information including: relative velocities between the mesh points and the adjacent mesh points nearby.

Correspondingly, to update the height field at intervals of a preset number of frames, the simulation result rendering module 140 may be configured to update the velocity field at intervals of a preset number of frames; and update the height field according to an updated velocity field at intervals of a preset number of frames.

Optionally, to update the velocity field at intervals of a preset number of frames, the simulation result rendering module 140 may be configured to update the velocity field at intervals of a preset number of frames according to a hydrodynamic equation; or obtain, in a case that an interactive volume interacts with the three-dimensional liquid, relative speeds of cubes approximate to the interactive volume with respect to the three-dimensional liquid, and immersion depths of the cubes in the three-dimensional liquid, and update the velocity field at intervals of a preset number of frames according to the relative speeds of the cubes with respect to the three-dimensional liquid, and the immersion depths of the cubes in the three-dimensional liquid.

Optionally, to update the height field according to an updated velocity field at intervals of a preset number of frames, the simulation result rendering module 140 may be configured to update the height field at intervals of a preset number of frames according to the updated velocity field and an SWE formula. The SWE formula represents the following relationship between a liquid level and a relative velocity: a change rate of a liquid level recorded by a mesh point is in a negative correlation with an outflow speed reflected by a recorded relative velocity with respect to an adjacent mesh point, and an outflow speed reflected by a relative velocity, which is recorded by a mesh point, with respect to an adjacent mesh point is in a positive correlation with a height difference between a liquid level recorded by the mesh point and a liquid level recorded by the adjacent mesh point.

Optionally, to update the velocity field according to the relative speeds of the cubes with respect to the three-dimensional liquid, and the immersion depths of the cubes in the three-dimensional liquid, the simulation result rendering module 140 may be configured to multiply, for each cube, the relative speed of the cube with respect to the three-dimensional liquid by a specified coefficient, adding a multiplying result to a relative velocity in the velocity field which is recorded by a mesh point of the target meshes that corresponds to the cube, and record an addition result in the mesh point of the target meshes that corresponds to the cube, so as to update the relative velocity in the velocity field which is recorded by the mesh point of the target meshes that corresponds to the cube. The specified coefficient is related to the immersion depth of the cube in the three-dimensional liquid.

Optionally, the liquid simulation apparatus may be further configured to invoke Compute Shade and, correspondingly, the simulation result rendering module 140 may update the height field at intervals of a preset number of frames by using Compute Shade.

An embodiment of the present disclosure further provides a liquid interaction apparatus. The liquid interaction apparatus may be considered as program modules that need to be configured in a CPU to implement the liquid interaction method provided in the embodiment of the present disclosure. The liquid interaction apparatus described below and the liquid interaction method described above may be referenced to each other.

Figure 16:
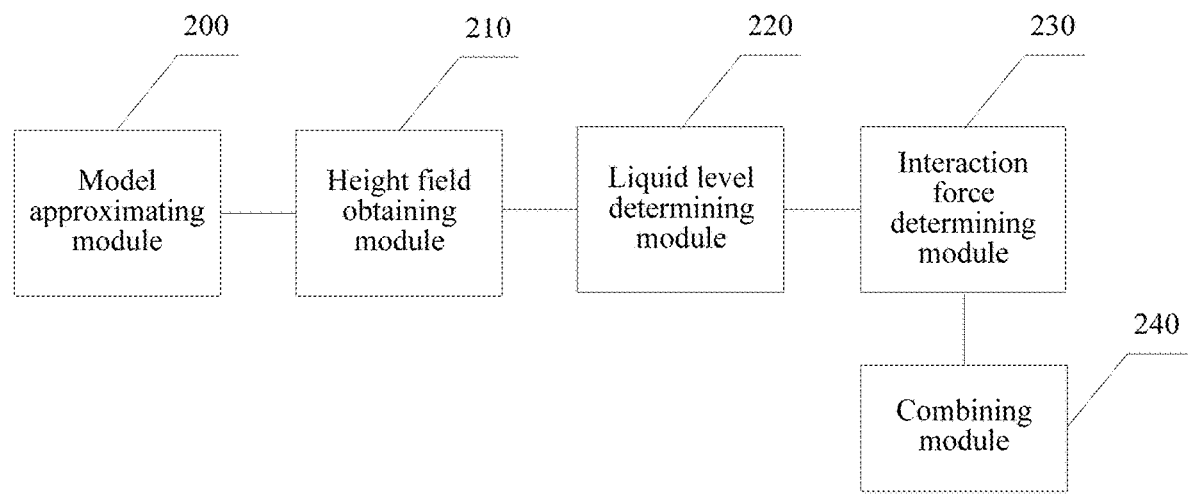
FIG. 16 is a structural block diagram of a liquid interaction apparatus according to an embodiment of the present disclosure.

FIG. 16 is a structural block diagram of a liquid interaction apparatus according to an embodiment of the present disclosure. Referring to FIG. 16, the liquid interaction apparatus may include a model approximating module 200, a height field obtaining module 210, a liquid level determining module 220, an interaction force determining module 230, and a combining module 240.

The model approximating module 200 is configured to approximate a model of an interactive volume by using a cube group, the cube group including multiple cubes. The height field obtaining module 210 is configured to obtain a height field of a to-be-simulated three-dimensional liquid in two-dimensional meshes, the height field corresponding to target meshes, the target meshes being corresponding meshes to which a plane of the to-be-simulated three-dimensional liquid is mapped in the two-dimensional meshes, and mesh points of the target meshes recording corresponding liquid levels of the to-be-simulated three-dimensional liquid.

The liquid level determining module 220 is configured to determine liquid levels corresponding to the cubes according to horizontal position coordinates of the cubes and the height field. The interaction force determining module 230 is configured to determine interaction forces between the to-be-simulated three-dimensional liquid and the cubes according to the liquid levels corresponding to the cubes. The combining module 240 is configured to combine the interaction forces between the to-be-simulated three-dimensional liquid and the cubes, and determine an interaction force between the to-be-simulated three-dimensional liquid and the interactive volume.

Optionally, to approximate a model of an interactive volume by using a cube group, the model approximating module 200 may be configured to divide a surrounding space of the model of the interactive volume into three-dimensional meshes; determine mesh points, which are located inside the model of the interactive volume, of the three-dimensional meshes; and generate corresponding cubes according to the mesh points located inside the model of the interactive volume, to obtain a cube group approximate to the model of the interactive volume.

Optionally, to determine liquid levels corresponding to the cubes according to horizontal position coordinates of the cubes and the height field, the liquid level determining module 220 may be configured to substitute horizontal position coordinates in spatial position coordinates of the cubes into a functional relationship represented by the height field, and determine corresponding liquid levels of the horizontal position coordinates of the cubes, to obtain the liquid levels corresponding to the cubes, the height field representing a functional relationship between two-dimensional plane coordinates and liquid levels of a to-be-simulated liquid.

Optionally, to determine interaction forces between the to-be-simulated three-dimensional liquid and the cubes according to the liquid levels corresponding to the cubes, the interaction force determining module 230 may be configured to determine immersion depths of the cubes in the to-be-simulated three-dimensional liquid according to vertical height coordinates of the cubes; and determine the interaction forces between the to-be-simulated three-dimensional liquid and the cubes according to the immersion depths of the cubes in the to-be-simulated three-dimensional liquid.

Optionally, the liquid interaction apparatus may be further configured to: obtain a velocity field, the velocity field corresponding to target meshes, the target meshes being corresponding meshes to which a plane of the to-be-simulated three-dimensional liquid is mapped in the two-dimensional meshes, and each mesh point of the target meshes recording a relative velocity with respect to an adjacent mesh point.

Correspondingly, to determine interaction forces between the to-be-simulated three-dimensional liquid and the cubes according to the immersion depths of the cubes in the to-be-simulated three-dimensional liquid, the interaction force determining module 230 may be configured to determine immersion volumes of the cubes in the to-be-simulated three-dimensional liquid according to the immersion depths of the cubes in the to-be-simulated three-dimensional liquid; and determine the interaction forces between the to-be-simulated three-dimensional liquid and the cubes according to the immersion volumes of the cubes in the to-be-simulated three-dimensional liquid, speeds of the cubes, and the speed of the to-be-simulated three-dimensional liquid. The speed of the to-be-simulated three-dimensional liquid is determined by the velocity field, and the speeds of the cubes is determined by a physical engine.

Optionally, to combine the interaction forces between the to-be-simulated three-dimensional liquid and the cubes, and determine an interaction force between the to-be-simulated three-dimensional liquid and the interactive volume, the combining module 240 may be configured to determine, according to interaction forces corresponding to central spatial coordinates of the cubes, corresponding interaction forces at positions that are in the model of the interactive volume and that correspond to the central spatial coordinates of the cubes, thereby obtaining the interaction force between the to-be-simulated three-dimensional liquid and the interactive volume.

Optionally, the interaction forces between the to-be-simulated three-dimensional liquid and the cubes include: acting forces exerted by the to-be-simulated three-dimensional liquid on the cubes, and acting forces exerted by the cubes on the to-be-simulated three-dimensional liquid.

Optionally, the liquid interaction apparatus may be further configured to: transmit, to the GPU, the relative speeds of the cubes with respect to the to-be-simulated three-dimensional liquid and the immersion depths of the cubes in the to-be-simulated three-dimensional liquid, so that the GPU updates the velocity field, where the relative speeds of the cubes with respect to the to-be-simulated three-dimensional liquid are determined by the speed of the to-be-simulated three-dimensional liquid and the speeds of the cubes.

An embodiment of the present disclosure further provides a simulation device for implementing a liquid simulation method. The structure of the simulation device may be similar to the structure shown in FIG. 1, and the simulation device includes a memory and a GPU.

The memory stores a program, the GPU invokes the program, and the program is configured to: obtain initial information; determine two-dimensional meshes according to the initial information; map a plane of a to-be-simulated three-dimensional liquid into the two-dimensional meshes, and determine corresponding target meshes to which the plane of the to-be-simulated three-dimensional liquid is mapped in the two-dimensional meshes; map liquid levels of the to-be-simulated three-dimensional liquid into the two-dimensional meshes, and record, in mesh points of the target meshes, the corresponding liquid levels of the to-be-simulated three-dimensional liquid, to obtain a corresponding height field of the to-be-simulated three-dimensional liquid in the two-dimensional meshes; and render a three-dimensional liquid according to updating of the height field, to obtain a liquid simulation result.

For details of function implementation and extended functions of the program, reference may be made to the description of the corresponding part above.

An embodiment of the present disclosure further provides a simulation device for implementing a liquid interaction method. The structure of the simulation device may be similar to the structure shown in FIG. 1, and the simulation device includes a memory and a CPU.

The memory stores a program, the CPU invokes the program, and the program is configured to: approximate a model of an interactive volume by using a cube group, the cube group including multiple cubes; obtain a height field of a to-be-simulated three-dimensional liquid in two-dimensional meshes, the height field corresponding to target meshes, the target meshes being corresponding meshes to which a plane of the to-be-simulated three-dimensional liquid is mapped in the two-dimensional meshes, and mesh points of the target meshes recording corresponding liquid levels of the to-be-simulated three-dimensional liquid; determine liquid levels corresponding to the cubes according to horizontal position coordinates of the cubes and the height field; determine interaction forces between the to-be-simulated three-dimensional liquid and the cubes according to the liquid levels corresponding to the cubes; and combine the interaction forces between the to-be-simulated three-dimensional liquid and the cubes, and determine an interaction force between the to-be-simulated three-dimensional liquid and the interactive volume.

For details of function implementation and extended functions of the program, reference may be made to the description of the corresponding part above.

An embodiment of the present disclosure further provides a storage medium configured to store program code. The program code is configured to perform any implementation of the liquid simulation method described in the foregoing embodiments, or perform any implementation of the liquid interaction method described in the foregoing embodiments.

An embodiment of this application further provides a computer program product including instructions. When the computer program product is run on a computer, the computer is enabled to perform any implementation of the liquid simulation method described in the foregoing embodiments, or perform any implementation of the liquid interaction method described in the foregoing embodiments.

The embodiments in this specification are all described in a progressive manner. Each embodiment focuses on a difference from other embodiments. For same or similar parts in the embodiments, reference may be made to each other. The apparatus disclosed in the embodiments corresponds to the method disclosed in the embodiments, and therefore is described briefly. For related parts, reference may be made to partial descriptions in the method.

A person of ordinary skill in the art may further realize that the exemplary units and algorithm steps described according to the embodiments disclosed in this specification may be implemented by electronic hardware, computer software, or a combination thereof. In order to specify clearly the interchangeability of the hardware and software, the components and steps of each embodiment are described generally according to the functions in the above description. Whether these functions are executed in the form of hardware or software depends on specific applications and design constraints of the technical solutions. A person of ordinary skill in the art may use different methods to implement the described functions for each specific application, but this implementation is not be considered as going beyond the scope of the present disclosure.

The steps of the method or algorithm described according to the embodiments disclosed in this specification can be implemented directly by hardware, a software program executed by a processor, or a combination thereof. The software program may be stored in a random-access memory (RAM), a memory, a read-only memory (ROM), an electrically programmable ROM, an electrically erasable programmable ROM, a register, a hard disk, a removable magnetic disk, a CD-ROM, or any other type of storage medium commonly known in the art.

The foregoing description about the disclosed embodiments enables a person skilled in the art to implement or use the present disclosure. Multiple modifications on these embodiments are obvious to a person skilled in the art. General principles defined in this specification can be implemented in other embodiments without departing from the core idea or scope of the present disclosure. Therefore, the present disclosure is not limited by the embodiments in this specification, but conforms to the widest scope consistent with the principles and novel features disclosed in this specification.

What is claimed is:

1. A liquid simulation method for a graphics processing unit (GPU), comprising:
   obtaining initial information;
   determining two-dimensional meshes according to the initial information;
   projecting a plane of a to-be-simulated three-dimensional (in x-y-z dimensions) liquid onto the two-dimensional (in x-y dimensions) meshes to determine target meshes;
   recording, in mesh points of the target meshes, corresponding liquid levels of plane coordinates of the to-be-simulated three-dimensional liquid, and obtaining a height field of the to-be-simulated three-dimensional liquid in the two-dimensional meshes, wherein the height field is a two-dimensional (in the x-y dimensions) planar mesh with each of the mesh points positioned on a same level along a liquid height dimension (in the z dimension) and recorded with a corresponding liquid height value of the to-be-simulated three-dimensional liquid; and
   rendering a three-dimensional liquid according to updating of the height field to obtain a liquid simulation result.

2. The liquid simulation method according to claim 1, wherein rendering the three-dimensional liquid according to updating of the height field to obtain the liquid simulation result comprises:
   updating the height field at intervals of a preset number of frames to obtain updated height field; and
   rendering the three-dimensional liquid according to the updated height field to obtain the liquid simulation result.

3. The liquid simulation method according to claim 2, wherein rendering the three-dimensional liquid according to the updated height field to obtain the liquid simulation result comprises:
   dividing a three-dimensional mesh model corresponding to the to-be-simulated three-dimensional liquid into meshes spliced by triangles;
   performing vertex offset on heights of vertices of the triangles according to the updated height field at intervals of the preset number of frames to obtain vertex positions of the triangles after the vertex offset; and
   rendering the three-dimensional liquid according to the vertex positions of the triangles after the vertex offset at intervals of the preset number of frames to obtain the liquid simulation result.

4. The liquid simulation method according to claim 3, wherein dividing the three-dimensional mesh model corresponding to the to-be-simulated three-dimensional liquid into meshes spliced by multiple triangles comprises:
   dynamically dividing the three-dimensional mesh model corresponding to the to-be-simulated three-dimensional liquid into the meshes spliced by the multiple triangles by using a tessellation technology; and performing vertex offset on heights of vertices of the triangles according to the updated height field to obtain vertex positions of the triangles after the vertex offset comprises:
   determining, according to corresponding liquid levels of the to-be-simulated three-dimensional liquid that are recorded in the height field updated at intervals of the preset number of frames, liquid levels corresponding to the vertices of the divided triangles; and
   adding heights of the vertices of the triangles with the corresponding liquid levels to obtain the vertex positions of the triangles after the vertex offset.

5. The liquid simulation method according to claim 2, wherein the method further comprises:
   determining flow information between mesh points of the target meshes and adjacent mesh points nearby, to obtain a corresponding velocity field of the to-be-simulated three-dimensional liquid in the two-dimensional meshes, the flow information including relative velocities between the mesh points and the adjacent mesh points nearby; and the updating the height field at intervals of a preset number of frames comprises:
   updating the velocity field at intervals of the preset number of frames; and
   updating the height field according to an updated velocity field at intervals of a preset number of frames.

6. The liquid simulation method according to claim 5, wherein updating the velocity field at intervals of the preset number of frames comprises:
   updating the velocity field at intervals of the preset number of frames according to a hydrodynamic equation; or
   obtaining, in response to determining an interactive volume interacts with the three-dimensional liquid, relative speeds of cubes approximate to the interactive volume with respect to the three-dimensional liquid, and immersion depths of the cubes in the three-dimensional liquid, and updating the velocity field at intervals of the preset number of frames according to the relative speeds of the cubes with respect to the three-dimensional liquid, and the immersion depths of the cubes in the three-dimensional liquid.

7. The liquid simulation method according to claim 6, wherein updating the velocity field according to the relative speeds of the cubes with respect to the three-dimensional liquid, and the immersion depths of the cubes in the three-dimensional liquid comprises:
   multiplying, for each cube, the relative speed of the cube with respect to the three-dimensional liquid by a specified coefficient, adding a multiplying result to a relative velocity in the velocity field which is recorded by a mesh point of the target meshes that corresponds to the cube, and recording an additional result in the mesh point of the target meshes that corresponds to the cube, so as to update the relative velocity in the velocity field which is recorded by the mesh point of the target meshes that corresponds to the cube, the specified coefficient being related to the immersion depth of the cube in the three-dimensional liquid.

8. The liquid simulation method according to claim 5, wherein updating the height field according to the updated velocity field at intervals of the preset number of frames comprises:
   updating the height field at intervals of the preset number of frames according to the updated velocity field and a shallow water equation (SWE) formula, wherein the SWE formula represents that a change rate of a liquid level recorded at a mesh point is in a negative correlation with an outflow speed of a relative velocity recorded at an adjacent mesh point, and that the outflow speed of the relative velocity; recorded at the adjacent mesh point is in a positive correlation with a height difference between the liquid level at the mesh point and a liquid level recorded at the adjacent mesh point.

9. A liquid interaction method for a central processing unit (CPU), the method comprising:
- generating a model of an interactive volume by using a cube group, the cube group including cubes;
- obtaining a height field of a to-be-simulated three-dimensional x-y-z dimensions) liquid in two-dimensional x-y dimensions) meshes, the height field corresponding to target meshes, the target meshes being determined by projecting a plane of the to-be-simulated three-dimensional liquid onto the two-dimensional meshes, and mesh points of the target meshes recording corresponding liquid levels of the to-be-simulated three-dimensional liquid, wherein the height field is a two-dimensional (in the x-y dimensions) planar mesh with each of the mesh points positioned on a same level along a liquid height dimension (in the z dimension) and recorded with a corresponding liquid height value of the to-be-simulated three-dimensional liquid;
- determining liquid levels corresponding to the cubes according to horizontal position coordinates of the cubes and the height field;
- determining interaction forces between the to-be-simulated three-dimensional liquid and the cubes according to the liquid levels corresponding to the cubes; and
- combining the interaction forces between the to-be-simulated three-dimensional liquid and the cubes, and determining an interaction force between the to-be-simulated three-dimensional liquid and the interactive volume.

10. The liquid interaction method according to claim 9, wherein generating the model of the interactive volume by using the cube group comprises:
- dividing a surrounding space of the model of the interactive volume into three-dimensional meshes;
- determining mesh points, which are located inside the model of the interactive volume, of the three-dimensional meshes; and
- generating corresponding cubes according to the mesh points located inside the model of the interactive volume to obtain the cube group.

11. The liquid interaction method according to claim 9, wherein the determining liquid levels corresponding to the cubes according to horizontal position coordinates of the cubes and the height field comprises:
- substituting horizontal position coordinates in spatial position coordinates of the cubes into a functional relationship represented by the height field, and determining corresponding liquid levels of the horizontal position coordinates of the cubes to obtain the liquid levels corresponding to the cubes, the height field representing a relationship between two-dimensional plane coordinates and liquid levels of a to-be-simulated liquid.

12. The liquid interaction method according to claim 9, wherein determining interaction forces between the to-be-simulated three-dimensional liquid and the cubes according to the liquid levels corresponding to the cubes comprises:
- determining immersion depths of the cubes in the to-be-simulated three-dimensional liquid according to vertical height coordinates of the cubes; and
- determining the interaction forces between the to-be-simulated three-dimensional liquid and the cubes according to the immersion depths of the cubes in the to-be-simulated three-dimensional liquid.

13. The liquid interaction method according to claim 12, wherein the method further comprises:
- obtaining a velocity field, the velocity field corresponding to the target meshes, each mesh point of the target meshes recording a relative velocity with respect to an adjacent mesh point; and the determining interaction forces between the to-be-simulated three-dimensional liquid and the cubes according to the immersion depths of the cubes in the to-be-simulated three-dimensional liquid comprises:
- determining immersion volumes of the cubes in the to-be-simulated three-dimensional liquid according to the immersion depths of the cubes in the to-be-simulated three-dimensional liquid; and
- determining the interaction forces between the to-be-simulated three-dimensional liquid and the cubes according to the immersion volumes of the cubes in the to-be-simulated three-dimensional liquid, speeds of the cubes, and a speed of the to-be-simulated three-dimensional liquid, the speed of the to-be-simulated three-dimensional liquid being determined by the velocity field, and the speeds of the cubes being determined by a physical engine.

14. A liquid simulation device, comprising: a central processing unit (CPU); a graphics processing unit (GPU); one or more memory for storing program code for the CPU and for the GPU to perform:
- generating, by the CPU, a model of an interactive volume by using a cube group, the cube group including cubes, and transmitting initial information and information of the cube group to the GPU;
- based on the initial information, updating, by the GPU, a height field and a velocity field by using a Compute Shader, and transmitting the height field and the velocity field to the CPU, wherein the height field is obtained by:
  - obtaining the height field of a to-be-simulated three-dimensional (in x-y-z dimensions) liquid in two-dimensional (in x-y dimensions) meshes, the height field corresponding to target meshes, the target meshes being determined by projecting a plane of the to-be-simulated three-dimensional liquid onto the two-dimensional meshes, and mesh points of the target meshes recording corresponding liquid levels of the to-be-simulated three-dimensional liquid, wherein the height field is a two-dimensional (in the x-y dimensions) planar mesh with each of the mesh points positioned on a same level along a liquid height dimension (in the z dimension) and recorded with a corresponding liquid height value of the to-be-simulated three-dimensional liquid;
- based on the height field, the velocity field, and the model of the interactive volume, calculating, by the CPU, an interaction force between the interactive volume and a three-dimensional liquid, and determining an acting force effect; and
- rendering, by the GPU and independently from the CPU, a three-dimensional liquid based on the updated height field using a Pixel Shader to obtain a liquid simulation result.

15. The liquid simulation device according to claim 14, wherein the program code further causes the GPU to perform:
- based on the information of the cube group, rendering the interactive volume in the liquid simulation result.

16. The liquid simulation device according to claim 14, wherein generating, by the CPU, the model of the interactive volume by using the cube group comprises:
- dividing a surrounding space of the model of the interactive volume into three-dimensional meshes;

determining mesh points, which are located inside the model of the interactive volume, of the three-dimensional meshes; and generating corresponding cubes according to the mesh points located inside the model of the interactive volume, to obtain the cube group.

17. The liquid simulation device according to claim 16, wherein updating, by the GPU, the height field and the velocity field by using the Compute Shader further comprises:

determining the two-dimensional meshes according to the initial information;

projecting the plane of the to-be-simulated three-dimensional liquid into the two-dimensional meshes, and determining the target meshes in the two-dimensional meshes; and recording, in mesh points of the target meshes, corresponding liquid levels of plane coordinates of the to-be-simulated three-dimensional liquid, and obtaining the height field of the to-be-simulated three-dimensional liquid in the two-dimensional meshes.

18. The liquid simulation device according to claim 17, wherein rendering, by the GPU, the three-dimensional liquid based on the updated height field using the Pixel Shader to obtain the liquid simulation result further comprises:

updating the height field at intervals of a preset number of frames to obtain updated height field; and rendering the three-dimensional liquid according to the updated height field to obtain the liquid simulation result.

19. The liquid simulation device according to claim 14, wherein calculating, by the CPU, the interaction force between the interactive volume and the three-dimensional liquid, and determining the acting force effect further comprises:

determining liquid levels corresponding to the cubes according to horizontal position coordinates of the cubes and the height field;

determining interaction forces between the to-be-simulated three-dimensional liquid and the cubes according to the liquid levels corresponding to the cubes; and combining the interaction forces between the to-be-simulated three-dimensional liquid and the cubes, and determining an interaction force between the to-be-simulated three-dimensional liquid and the interactive volume.

20. The liquid simulation device according to claim 19, wherein determining interaction forces between the to-be-simulated three-dimensional liquid and the cubes according to the liquid levels corresponding to the cubes comprises:

determining immersion depths of the cubes in the to-be-simulated three-dimensional liquid according to vertical height coordinates of the cubes; and determining the interaction forces between the to-be-simulated three-dimensional liquid and the cubes according to the immersion depths of the cubes in the to-be-simulated three-dimensional liquid.

* * * * *